United States Patent [19]
Ammo et al.

[11] Patent Number: 6,159,784
[45] Date of Patent: Dec. 12, 2000

[54] METHOD OF PRODUCING SEMICONDUCTOR DEVICE

[75] Inventors: Hiroaki Ammo; Hiroyuki Miwa, both of Kanagawa, Japan

[73] Assignee: Sony Corporation, Tokyo, Japan

[21] Appl. No.: 09/332,038

[22] Filed: Jun. 14, 1999

[30] Foreign Application Priority Data

Jun. 22, 1998  [JP]  Japan  ................................. 10-174971

[51] Int. Cl.[7] .............................................. H01L 21/8249
[52] U.S. Cl. ............................................ 438/234; 438/236
[58] Field of Search .................................... 438/234, 236, 438/197, 142

[56] References Cited

U.S. PATENT DOCUMENTS 5,081,515  1/1992  Murata et al. ............................ 357/42
5,525,530  6/1996  Watabe ..................................... 437/34

Primary Examiner—Andrew Tran
Assistant Examiner—Bradley K Smith
Attorney, Agent, or Firm—Sonnenschein, Nath & Rosenthal

[57] ABSTRACT

A method of producing a semiconductor device by which the resistivities of the base, collector, and source/drain regions in a Bi-CMOS are decreased and the production step is simplified. A method of producing a semiconductor device comprising the steps of forming a gate electrode (the first semiconductor layer) on a substrate; forming an insulating film; forming a second semiconductor layer; leaving the second semiconductor layer and the insulating film on the bipolar part and removing them on the CMOS part to form sidewalls on the side faces of the gate electrode; forming source/drain regions; forming a Ti layer over the entire surface and forming silicide on the surfaces of the second semiconductor layer, the source/drain regions, and the gate electrode; and forming a base electrode by patterning the second semiconductor layer.

10 Claims, 17 Drawing Sheets

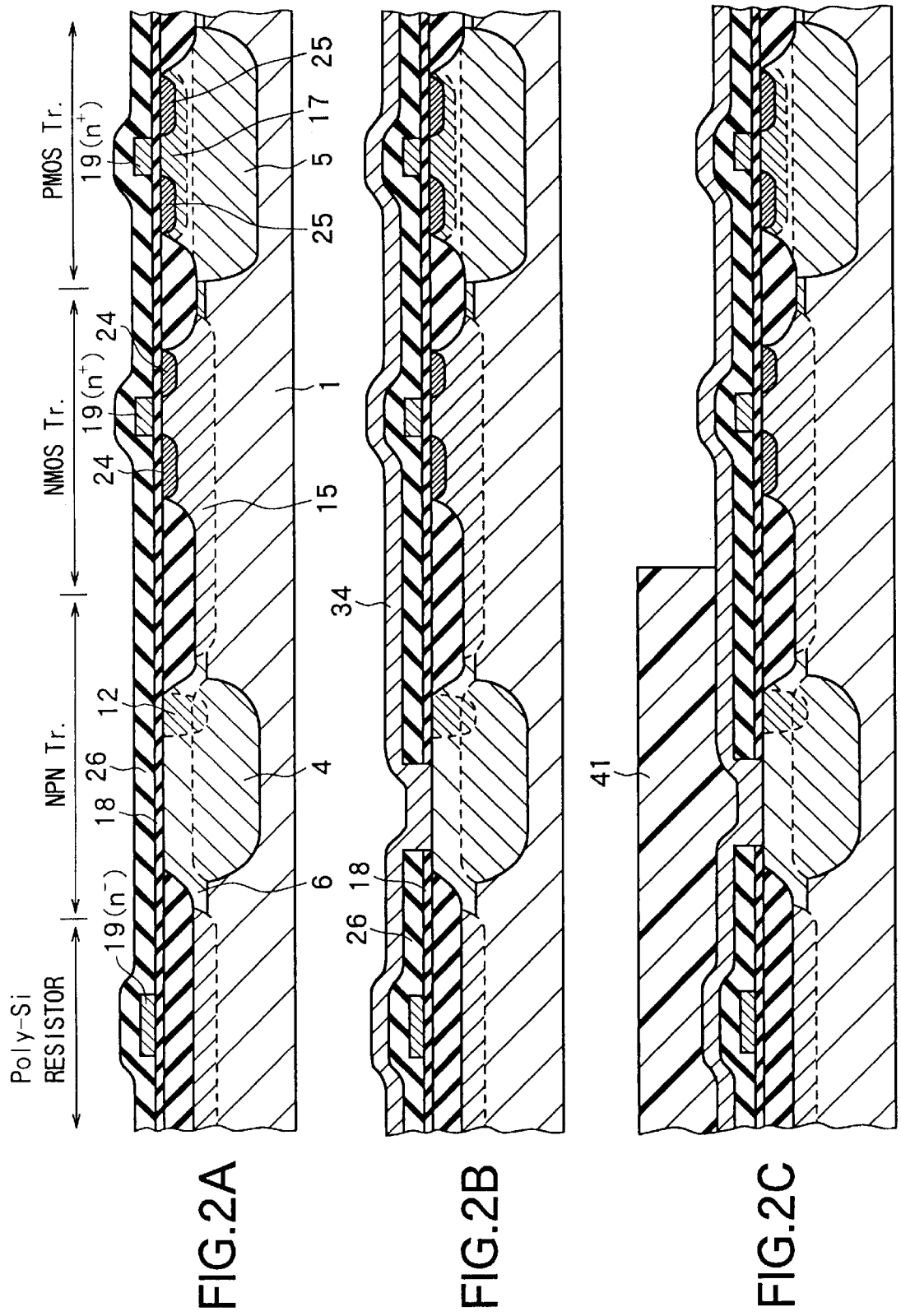

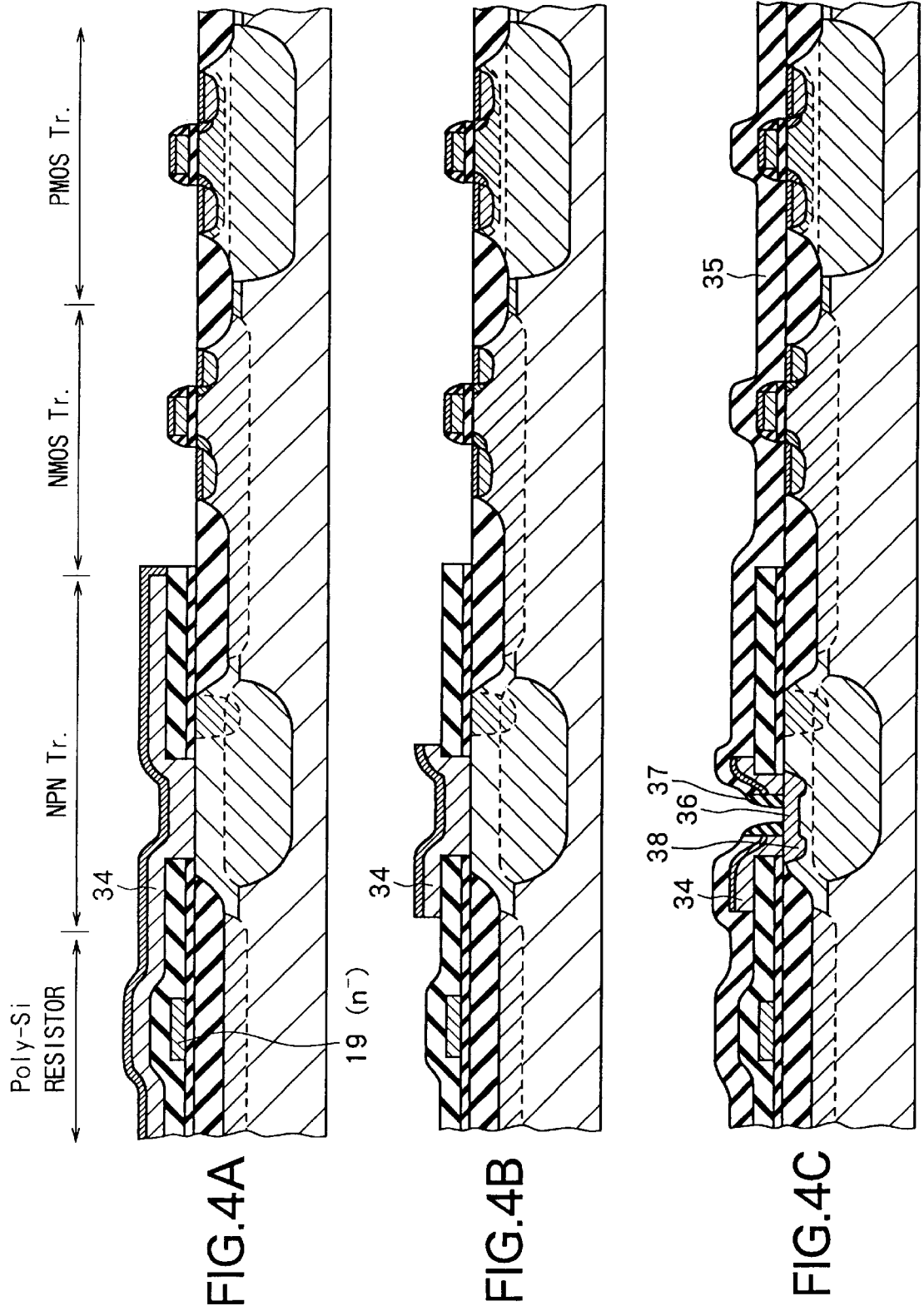

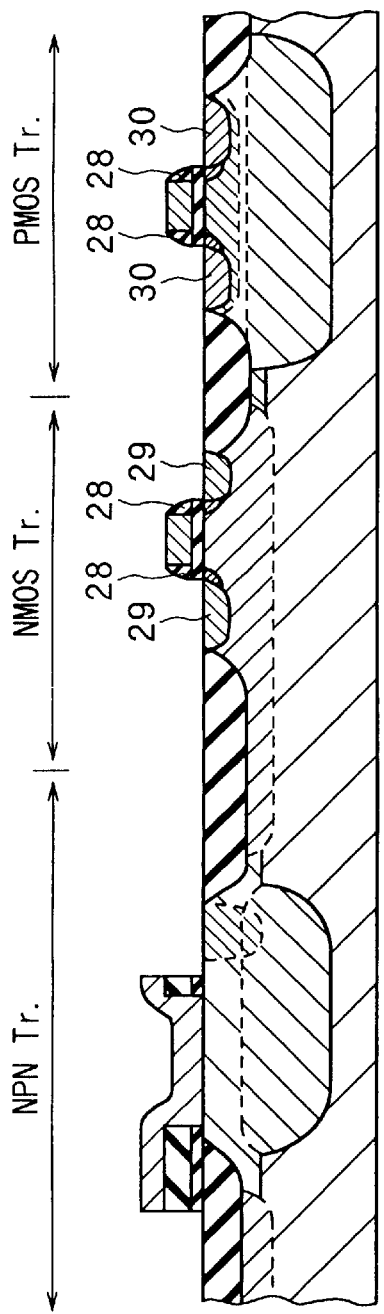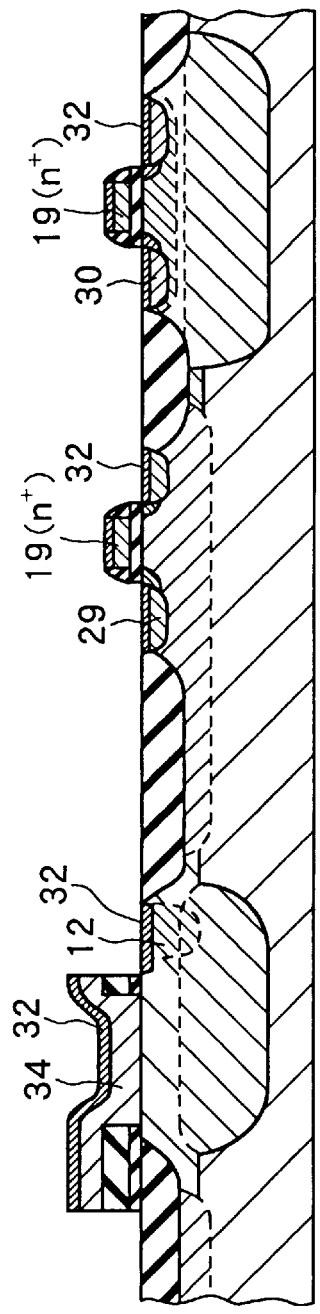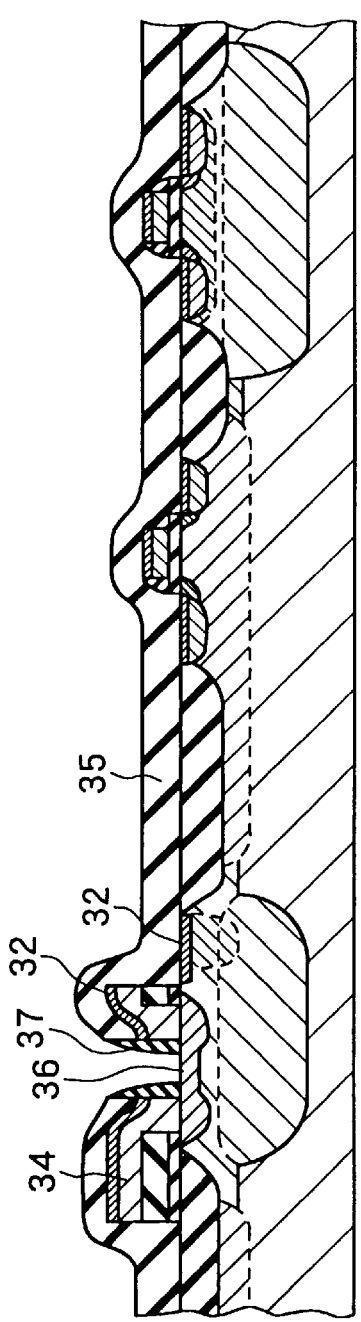

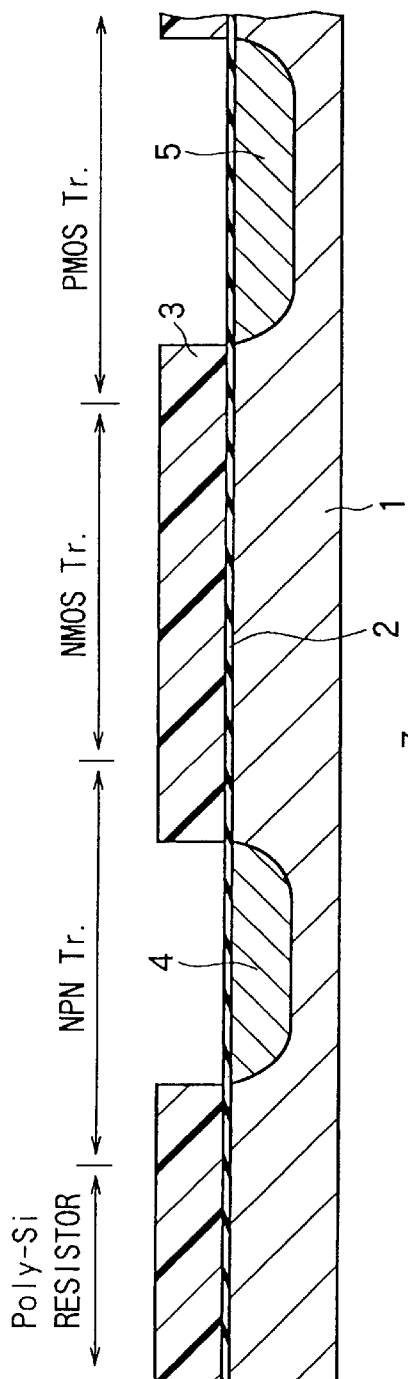
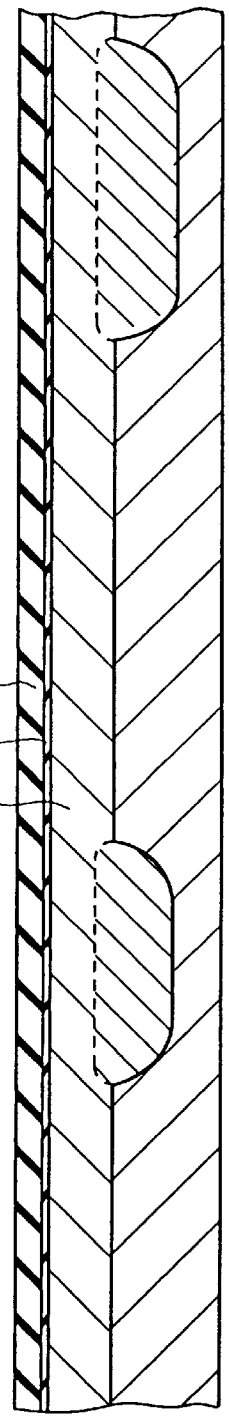
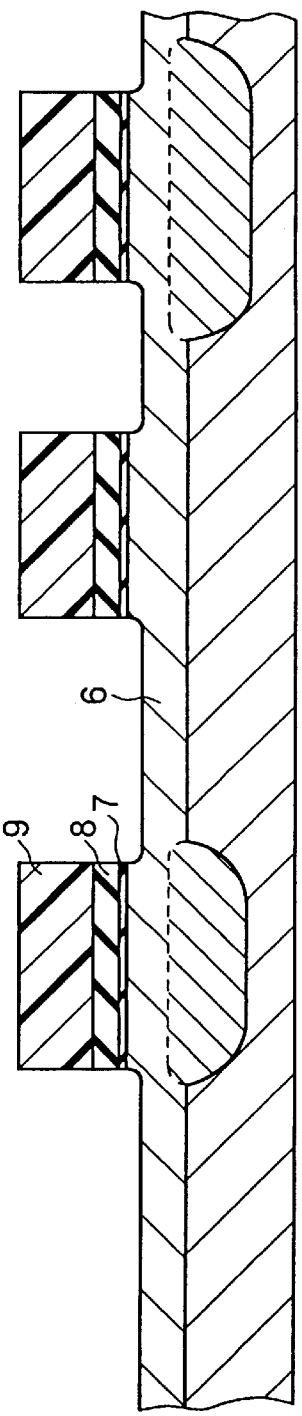
FIG.9A (Prior Art)
FIG.9B (Prior Art)
FIG.9C (Prior Art)

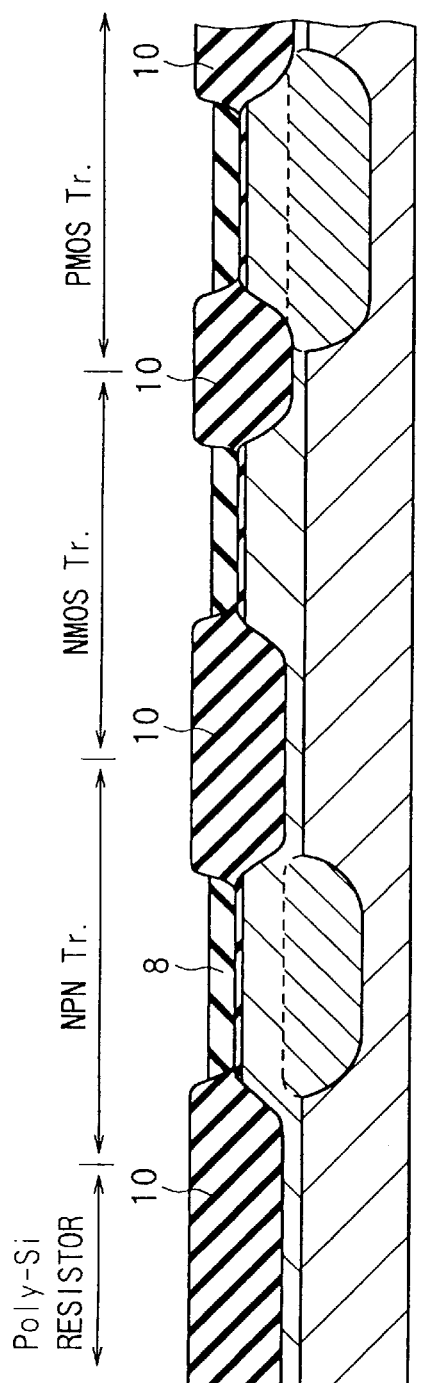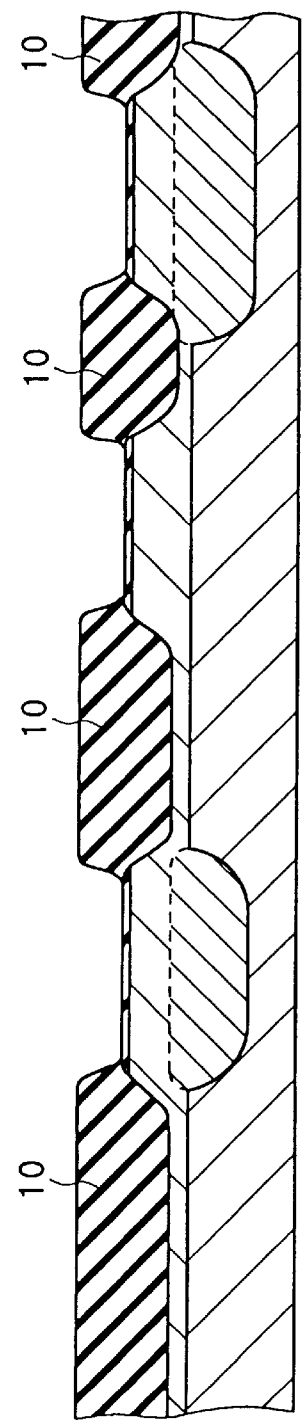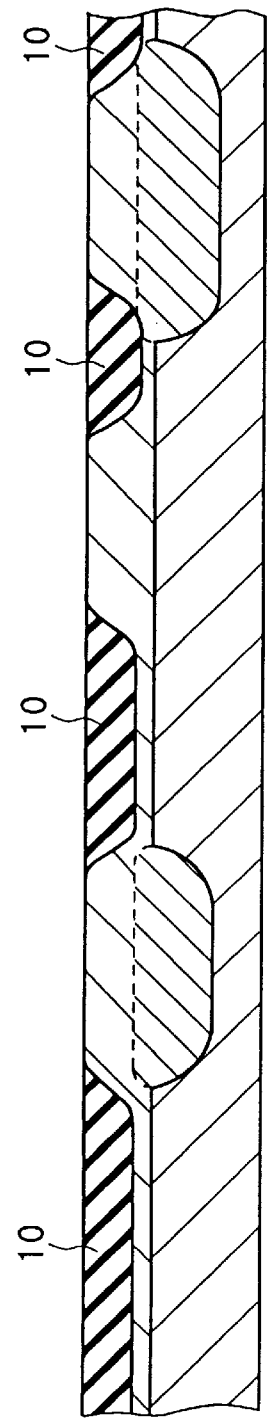
FIG.10A (Prior Art)
FIG.10B (Prior Art)
FIG.10C (Prior Art)

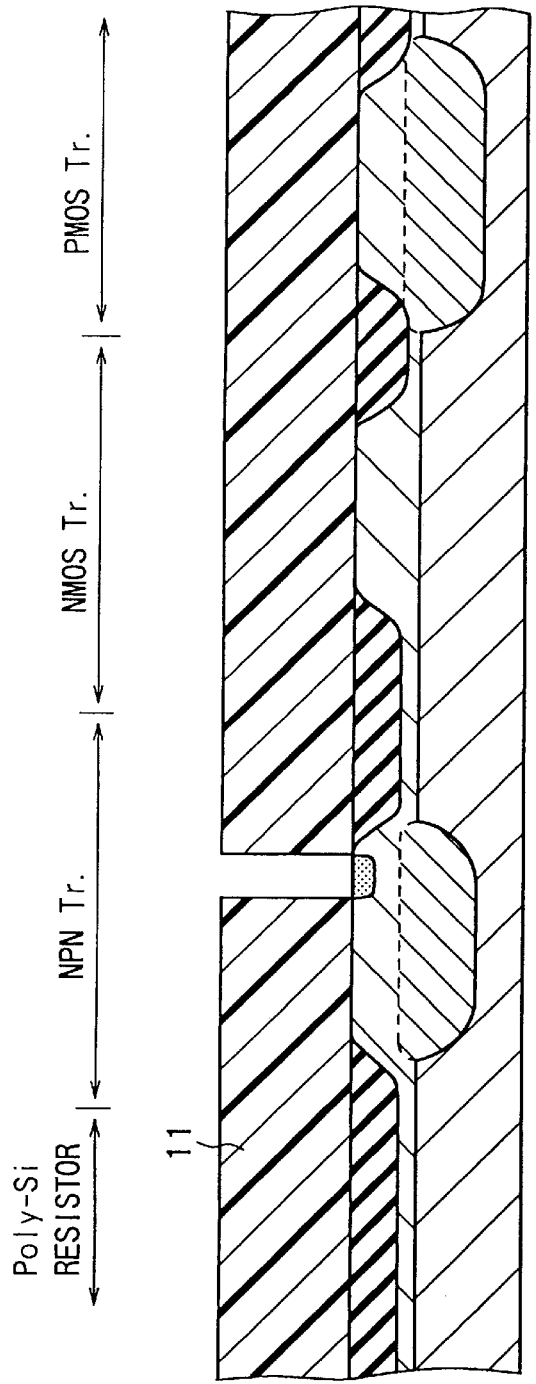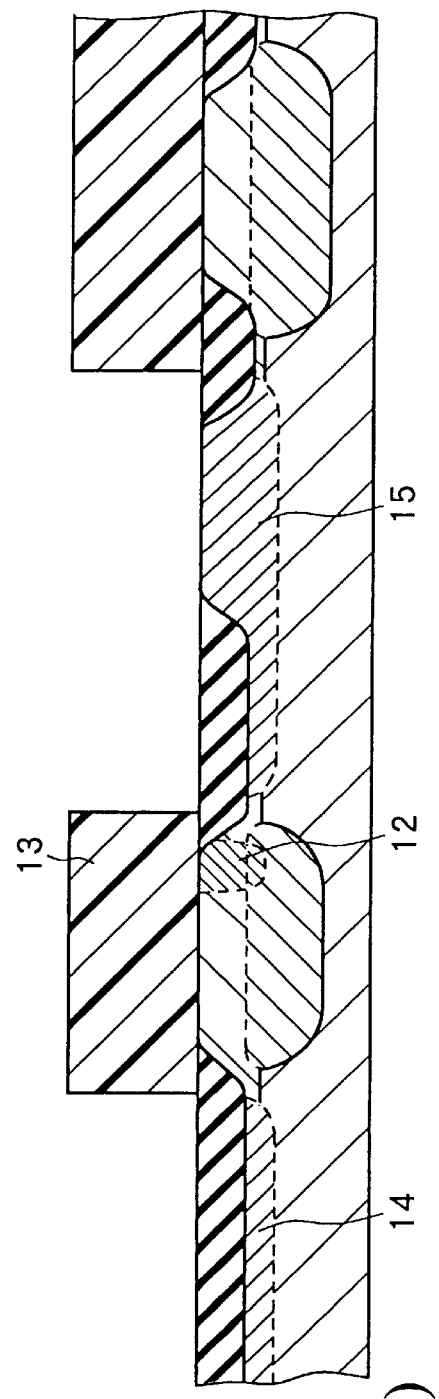
FIG.11A (Prior Art)
FIG.11B (Prior Art)

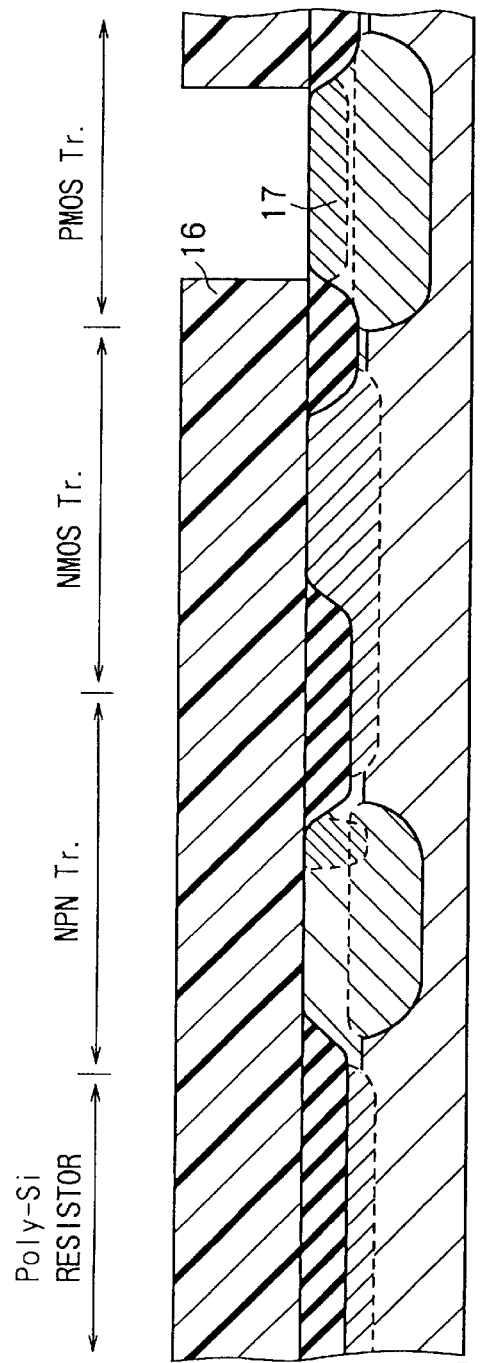
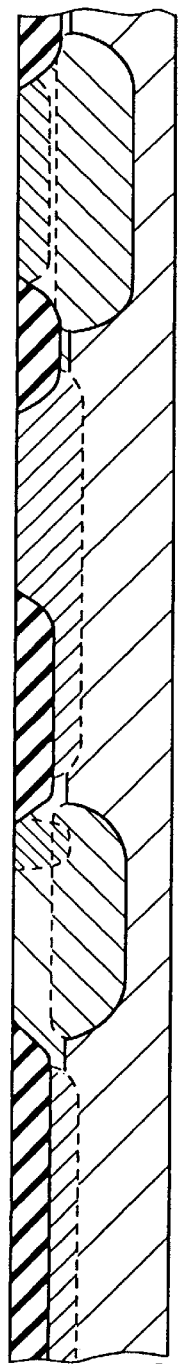
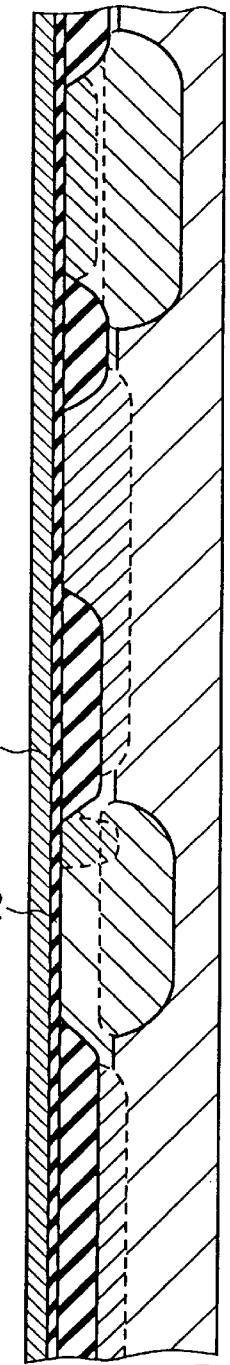
FIG.12A (Prior Art)
FIG.12B (Prior Art)
FIG.12C (Prior Art)

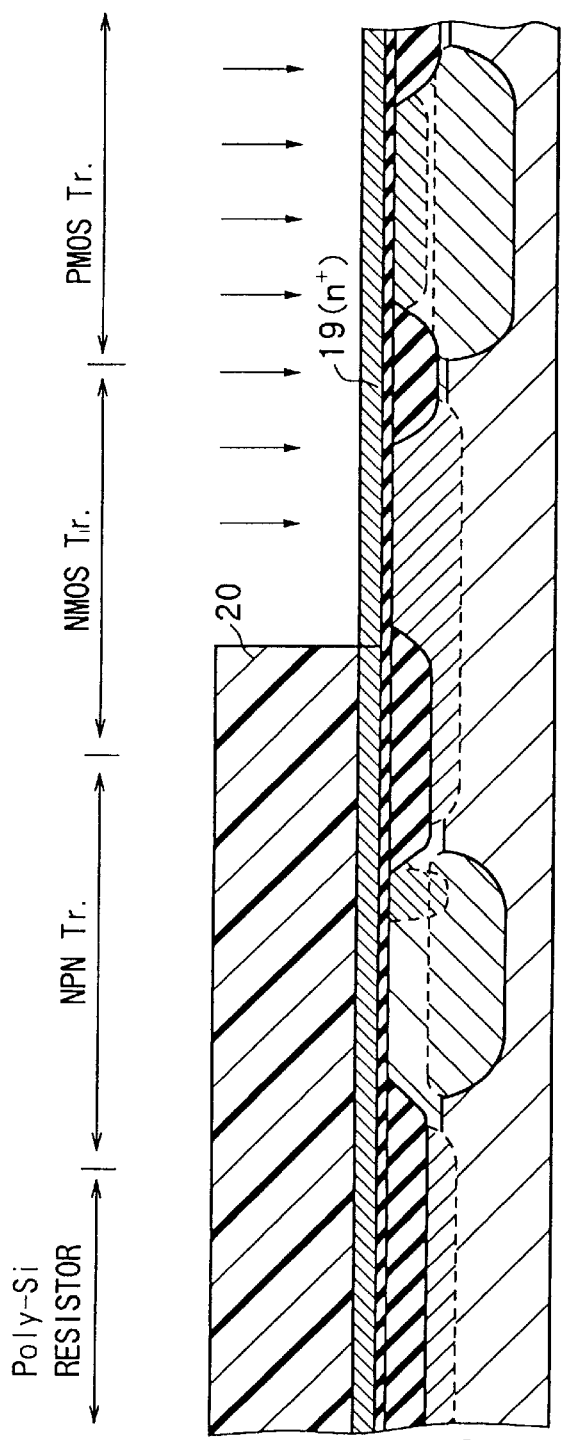
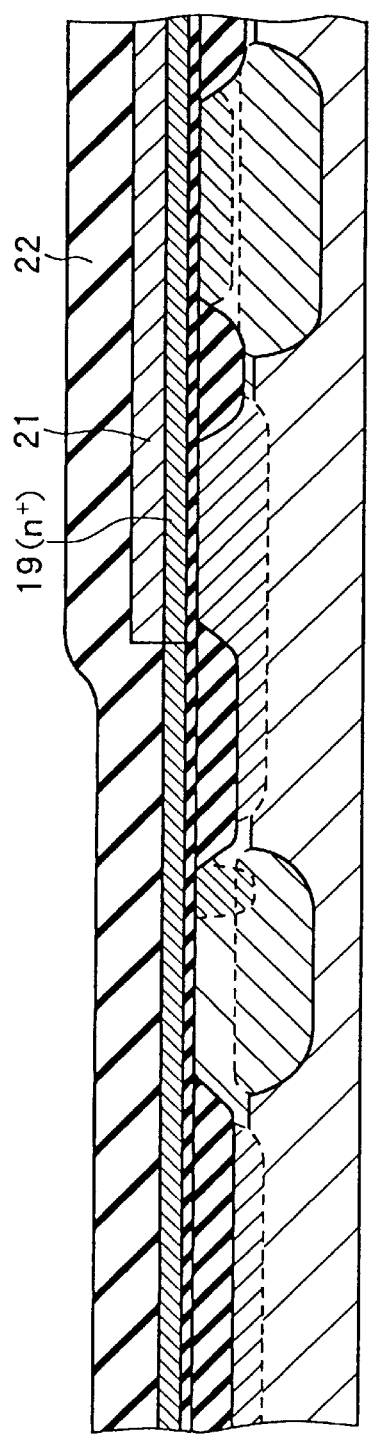
FIG.13A (Prior Art)
FIG.13B (Prior Art)

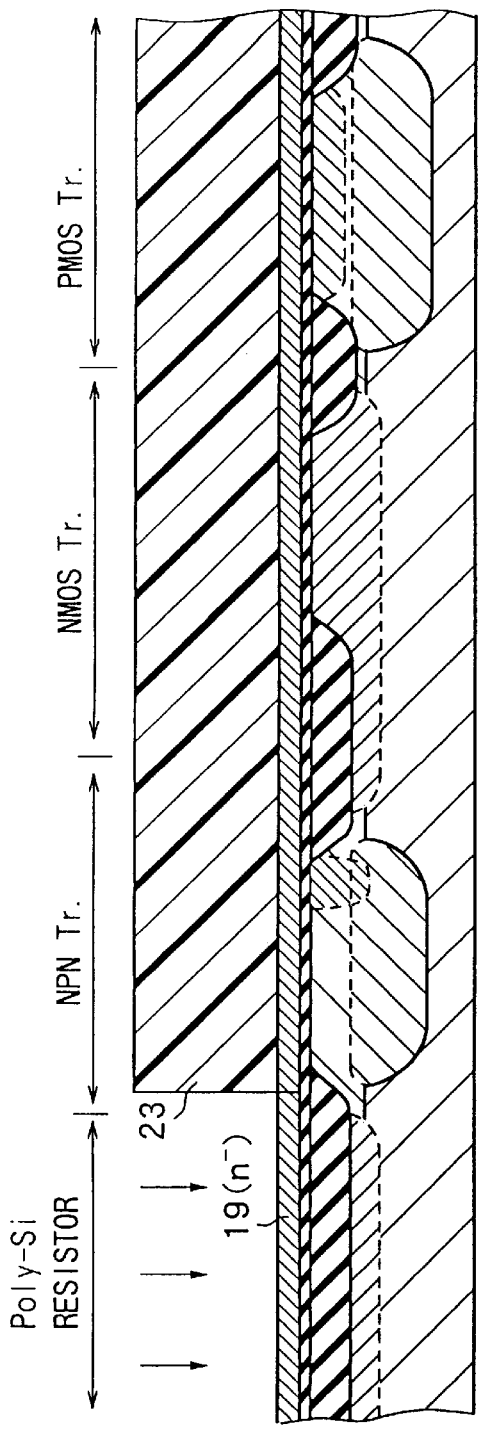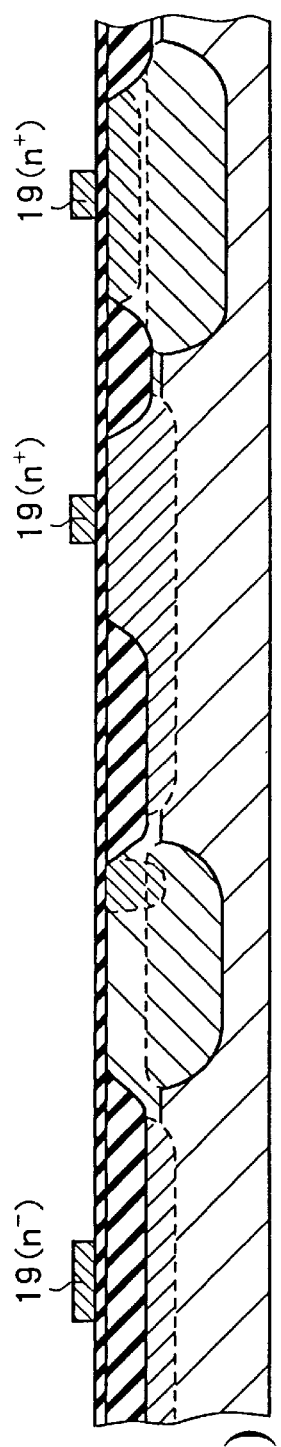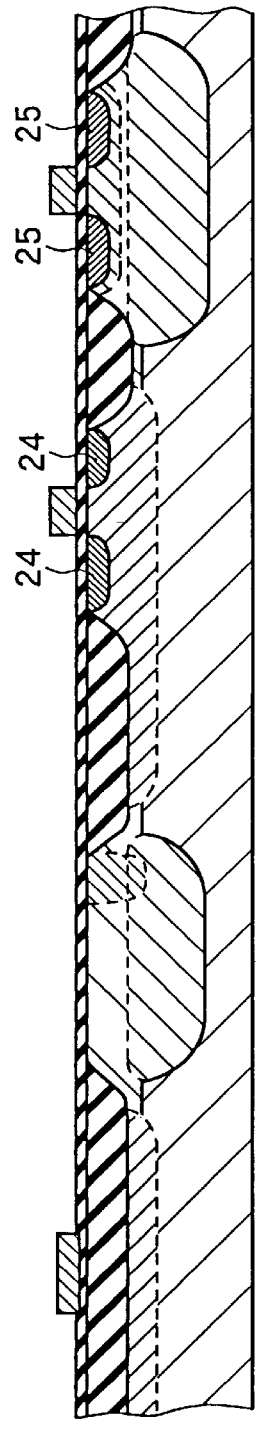
FIG.14A (Prior Art)
FIG.14B (Prior Art)
FIG.14C (Prior Art)

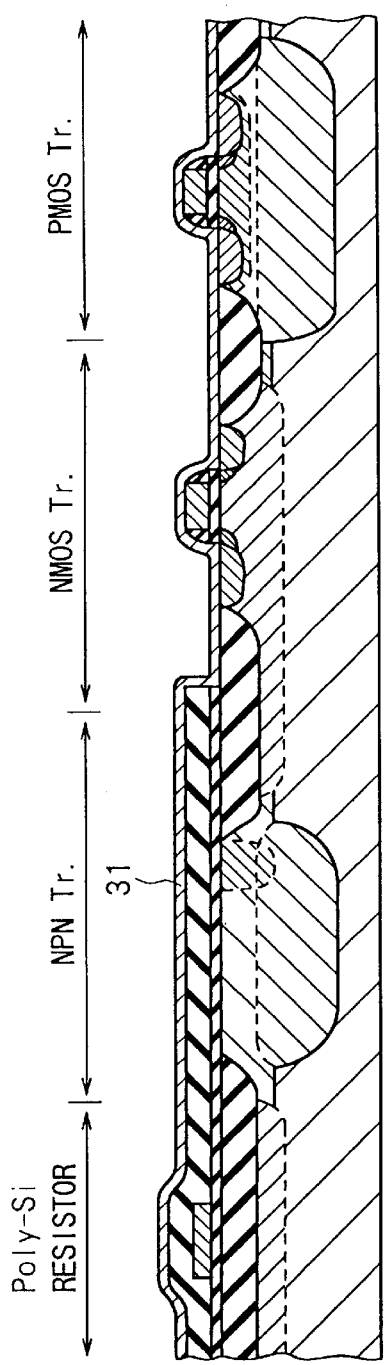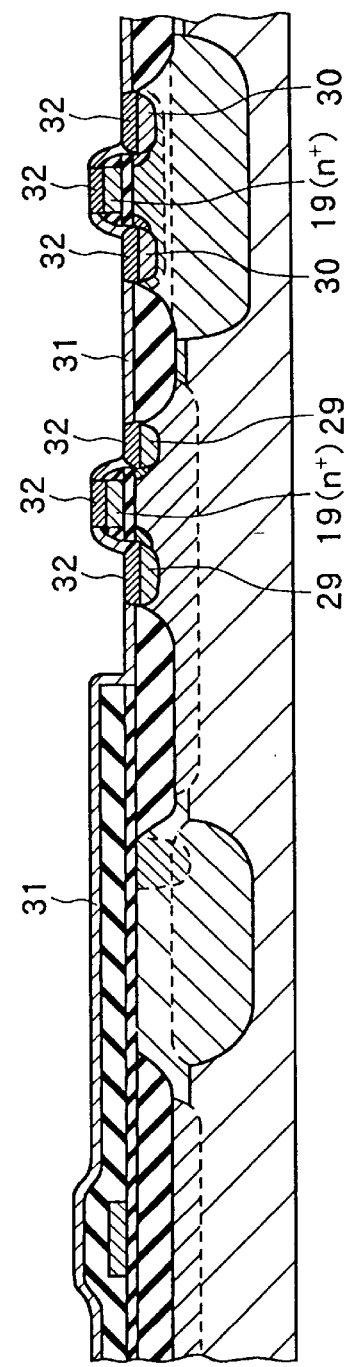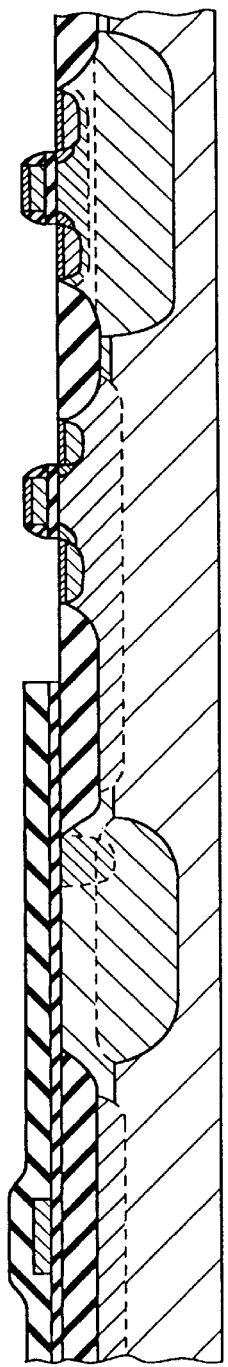
FIG.16A (Prior Art)
FIG.16B (Prior Art)
FIG.16C (Prior Art)

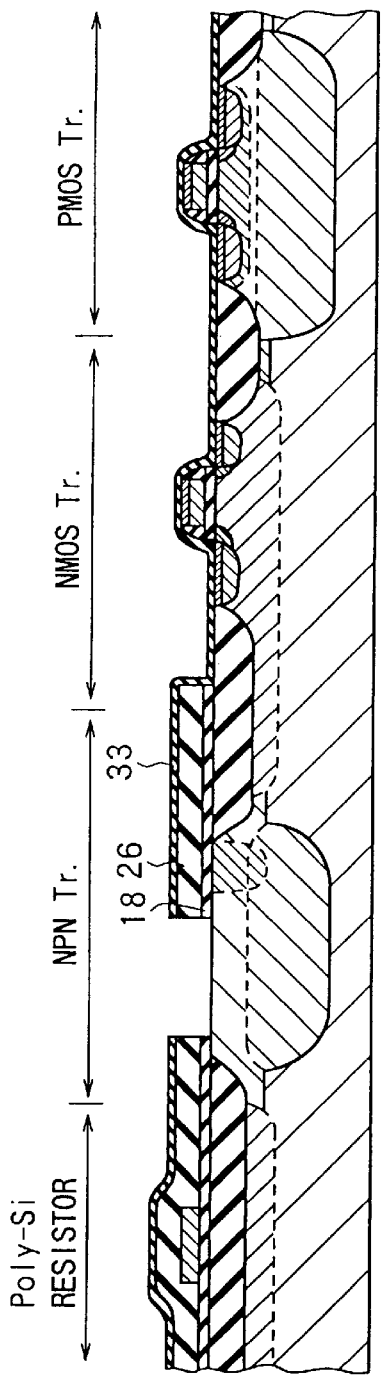
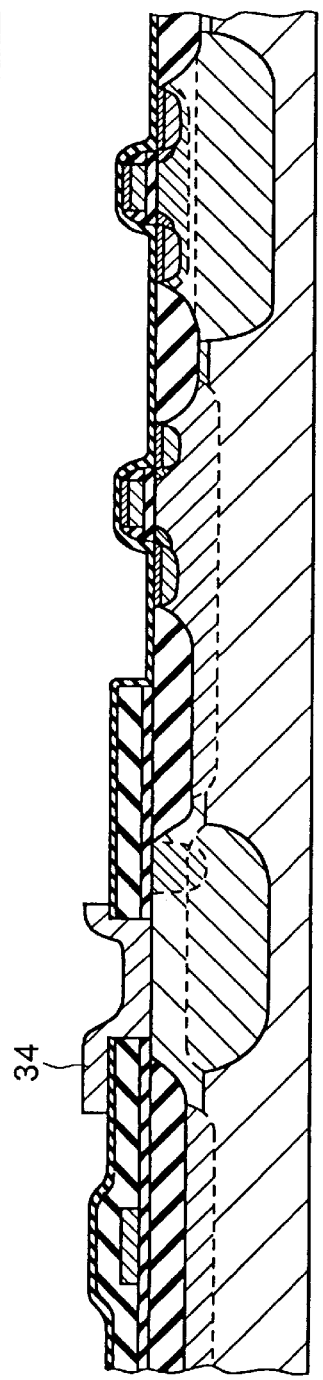
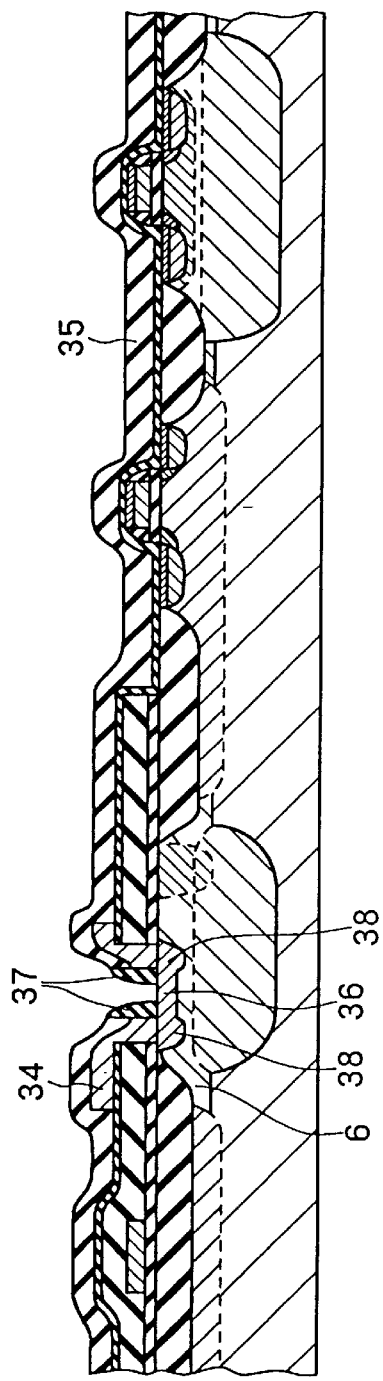
FIG.17A (Prior Art)
FIG.17B (Prior Art)
FIG.17C (Prior Art)

METHOD OF PRODUCING SEMICONDUCTOR DEVICE

BACKGROUND OF THE INVENTION

1. Field of the Invention

The present invention relates to a method of producing a semiconductor device comprising a BiCMOS transistor, more particularly a method of producing a semiconductor device wherein the resistivity of a base polysilicon electrode of a bipolar transistor and the resistivity of source/drain regions of a MOS transistor with an LDD structure are decreased and the production steps can be simplified.

2. Description of the Related Art

In recent years, electronic apparatuses have been made more compact, light in weight, and reduced in power consumption. Along with this, the need for higher integration and miniaturization of semiconductor devices has risen. Thus there has been active effort made to develop a bipolar-CMOS (Bi-CMOS) combining a CMOS having the characteristics of a low power consumption and high integration and a bipolar transistor having the characteristics of high driving force and high speed.

A cross-sectional view of a BiCMOS transistor produced by the method of production of the prior art is shown in FIG. 8. The bipolar transistor part has a double-polysilicon structure suitable for high speeds, while the MOS transistor part is made an LDD structure and the surface of gate electrode and source/drain regions are silicided to achieve miniaturization and higher speed.

In the semiconductor device shown in FIG. 8, a resistor formed by n⁻ polysilicon 19(n⁻) is formed in the polysilicon resistor part. In the vertical NPN transistor part, below the n-type epitaxial layer 6 forming an n-type collector region, an n-type buried collector layer 4 is formed for raising the withstand voltage between base and collector. A p-type base region consisting of an intrinsic base region 36 and a graft base region 38 connected to each other, is formed at the surface of the n-type epitaxial layer 6. An n-emitter diffusion layer 39' is formed at that surface layer.

In the NMOS transistor part, n-type source/drain regions 29 are formed at the surface of a p-well 15. Between the source and drain is formed a gate electrode formed by n⁺ polysilicon 19(n⁺) via a gate oxide film 18. The surface of the n-type source/drain region 29 and the n⁺ gate electrode 19(n⁺) are silicided for decreasing the resistance and become titanium silicide 32.

In the PMOS transistor part, an n-type isolation layer 5 is formed for isolation from the p-type substrate 1 and, further, an n-well 17 is formed in the n-type epitaxial layer 6. P-type source/drain regions 30 are formed at the surface layer of the n-well 17, and a gate electrode formed by an n⁺ polysilicon 19(n⁺) is formed via a gate oxide film 18 between the source and drain. The surface of the p-type source/drain region 30 and the n⁺ gate electrode 19(n⁺) are also silicided for decreasing the resistance and become titanium silicide 32.

At the surface of the substrate between transistors, a LOCOS 10 is formed. Under the LOCOS 10, a p-type buried isolation region 14 connecting to the p-type Si substrate 1 is formed.

Below, an explanation will be made of a conventional method of producing the above semiconductor device formed with the BiCMOS transistor with reference to FIG. 9A to FIG. 17C. First, as shown in FIG. 9A, a p-type (100) Si substrate 1 is formed with an oxide film 2 by for example thermal oxidation to a thickness of about 10 nm, then a photoresist 3 is deposited over the entire surface. For forming the n-type buried collector layer 4 in the NPN transistor forming region and for forming the n-type isolation layer 5 in the PMOS transistor forming region, openings are formed in the photoresist 3 as shown in FIG. 9A. Using the photoresist 3 as a mask, As, for example, is ion-implanted to form n-buried layers (n-buried collector layer 4 and n-isolation layer 5).

The oxide film 2 is removed, then, as shown in FIG. 9B, an n-type epitaxial layer 6 of a resistance of 1 to 5 Ωcm is formed to a thickness of about 0.7 to 2.0 μm. At the surface of the n-type epitaxial layer 6, an oxide film 7 is formed by thermal oxidation to a thickness of about 50 nm, then a silicon nitride film 8 is formed by the CVD (chemical vapor deposition) method to a thickness of about 100 nm.

Next, a photoresist 9 is deposited over the entire surface, then, as shown in FIG. 9C, the photoresist 9 is patterned to make openings in the isolation regions. Using the photoresist 9 as a mask, the silicon nitride film 8 and the oxide film 7 are removed, then the Si substrate (n-type epitaxial layer 6) is etched to about 300 to 750 nm. After this, steam-oxidation is performed at 1000° C. to 1050° C. for 3 to 8 hours, whereby, as shown in FIG. 10A, a field oxide film (LOCOS) 10 is formed to a thickness of 600 to 1500 nm.

Next, as shown in FIG. 10B, the silicon nitride film 8 is removed by etching with hot phosphoric acid. Further, as shown in FIG. 10C, the surface of the LOCOS 10 is flattened by light-etching using hydrofluoric acid, for example. Due to this, the oxide film 7 is removed.

As shown in FIG. 11A, a photoresist 11 is deposited over the entire surface, then an opening is formed in the photoresist 11 for forming a collector plug (n⁺ sinker) of the NPN transistor. Using the photoresist 11 as a mask, phosphor (P) is ion-implanted under conditions of 70 keV in acceleration energy and $5 \times 10^{15}$ atoms/cm² in dosage, for example. After this, annealing is performed at 1000° C. for 30 minutes to diffuse the impurity, and as shown in FIG. 11B, an n⁺ sinker 12 is formed in the NPN transistor.

Further, a photoresist 13 is deposited over the entire surface and, as shown in FIG. 11B, openings are formed in the photoresist 13 for forming a p-type buried isolation region 14 and a p-well 15 of the NMOS transistor. Using the photoresist 13 as a mask, boron B is ion-implanted under conditions of 200 to 720 keV in acceleration energy and $1 \times 10^{13}$ to $1 \times 10^{14}$ atoms/cm² in dosage, for example.

Next, as shown in FIG. 12A, a photoresist 16 is deposited and patterned as required, then an n-well 17 is formed in the PMOS transistor part using the photoresist 16 as a mask. After this, the photoresist 16 is removed. Due to this, the structure shown in FIG. 12B is obtained.

As shown in FIG. 12C, a gate oxide film 18 is formed by thermal oxidation at 850 to 950° C. to a thickness of 15 to 50 nm. A polysilicon layer 19 is formed by the CVD process over the entire surface at a thickness of 150 to 300 nm.

Next, a photoresist 20 is deposited over the entire surface, then, as shown in FIG. 13A, an opening is formed in the photoresist 20 at the MOS transistor forming region. Using the photoresist 20 as a mask, an n-type impurity is ion-implanted in a high concentration to change the polysilicon layer 19 of the MOS transistor forming region into an n⁺ polysilicon layer.

Alternatively, the above step of forming the n⁺ polysilicon layer may be performed by diffusion of phosphorus (P) from a PSG layer 21, as shown in FIG. 13B. In this case, first, the PSG layer 21 is deposited over the entire surface of the polysilicon layer 19, then the PSG layer 21 is removed except from the MOS transistor forming region. An oxide film 22 is deposited on this and heat treatment is performed. Due to this, an n⁺ polysilicon layer 19(n⁺) is formed.

Next, as shown in FIG. 14A, a photoresist 23 is deposited, and an opening is formed in the photoresist 23 at the polysilicon resistance forming region. Using the photoresist 23 as a mask, an n-type impurity is ion-implanted in a low concentration to change the polysilicon layer 19 on the polysilicon resistor forming region into an n⁻ polysilicon layer 19(n⁻).

The photoresist 23 is removed, then dry-etching is performed by for example a $Cl_2/CH_2F_2/SF_6$ gas system using a resist pattern (not shown) to form, as shown in FIG. 14B, gate polysilicon 19(n⁺) of the MOS transistors and a polysilicon resistor 19(n⁻).

After this, as shown in FIG. 14C, an n-type impurity is ion-implanted into the NMOS transistor forming region using the gate polysilicon 19(n⁺) as a mask to form an n-type LDD 24 by self-alignment. Further, a p-type impurity Is ion-implanted Into the PMOS transistor forming region using the gate polysilicon 19(n⁺) as a mask to form a p-type LDD 25 by self alignment.

Next, as shown in FIG. 15A, an oxide film ($SiO_2$) 26 is formed over the entire surface at a thickness of about 200 nm. As shown in FIG. 15B, a photoresist 27 is deposited over the entire surface, and an opening is formed in the photoresist 27 at the MOS transistor forming region. Using the photoresist 27 as a mask, RIE is performed on the oxide 26 and the gate oxide 18 to form an LDD spacer (sidewall) 28 of a width of 0.15 $\mu$m.

The photoresist 27 is removed, then, as shown in FIG. 15C, an n-type impurity is ion-implanted into the NMOS transistor forming region using the LDD spacer 28 as a mask to therefore form the n⁺ source/drain regions 29. Further, a p-type impurity is ion-implanted into the PMOS transistor forming region using the LDD spacer 28 as a mask to thereby form the p⁺ source/drain regions 30.

Next, as shown in FIG. 16A, a refractory metal layer such as a Ti layer 31 is formed by sputtering or another process over the entire surface. By annealing at 500 to 700° C. for about 10 to 30 minutes, the surface of the source/drain regions 29, 30 and the polysilicon 19(n⁺) on the gate electrode are silicided as shown as titanium silicide ($TiSi_x$) 32 in FIG. 16B.

After this, the unreacted parts of the Ti layer 31 formed on the insulating film are removed by wet-etching. Due to this, the structure shown in FIG. 16C is obtained.

As shown in FIG. 17A, an oxide film ($SiO_2$ film) 33 is formed over the entire surface at a thickness of about 100 nm. Dry-etching is performed on the oxide film 33, the oxide film 26, and the gate oxide film 18 on the active region of the NPN transistor to form an opening and to expose the Si substrate.

Next, a polysilicon layer is formed by the CVD process over the entire surface at a thickness of about 150 to 300 nm and $BF_2$ is ion-implanted to change the layer to p⁺ polysilicon. Next, dry-etching is performed using a resist pattern (not shown) to form the base electrode 34 of the NPN transistor, as shown in FIG. 17B.

As shown in FIG. 17C, an oxide film ($SiO_2$) 35 is formed by the CVD process over the entire surface at a thickness of about 300 nm. The oxide film 35 and the polysilicon layer (the base electrode 34) on the emitter forming region of the NPN transistor are etched in sequence to form an opening and expose the Si substrate. In the opening of the emitter forming region, $BF_2$, for example, is ion-implanted under conditions of 30 to 50 keV in acceleration energy and $1\times10^{13}$ to $1\times10^{14}$ atoms/cm² in dosage to form an intrinsic base region 36 of the NPN transistor.

Moreover, for forming a sidewall at the emitter forming region, an oxide film (not shown) is formed by the CVD process over the entire surface at a thickness of about 600 nm, then annealing is performed at 850 to 900° C. for 10 minutes and the oxide film (not shown) is etchbacked over the entire surface. Due to this, a sidewall 37 for isolating the emitter/base is formed.

Due to the annealing at this time, the p-type impurity diffuses from the polysilicon base electrode 34 of the NPN transistor into the n-type epitaxial layer 6. Thus, a graft base region 38 is formed and is connected to the activated intrinsic base region 36.

Next, for forming the emitter polysilicon 39 (FIG. 8) of the NPN transistor, a polysilicon layer is deposited by the CVD process over the entire surface at a thickness of about 150 nm, then arsenic (As) is ion-implanted under conditions of 30 to 70 keV in acceleration energy and $1\times10^{15}$ to $1\times10^{16}$ atoms/cm² in dosage. Next, by annealing at 1000 to 1100° C. for 5 to 30 seconds, the impurity diffuses from the emitter polysilicon 39 to form an emitter diffusion layer 39' as shown in FIG. 8. After this, the emitter polysilicon 39 is patterned by dry-etching to leave the emitter part.

Further, as shown in FIG. 8, RIE is performed to form contact holes in the polysilicon base electrode 34 and n⁺ sinker 12, that is, collector plug, of the NPN transistor and on the gate polysilicon 19(n⁺) and the source/drain regions 29, 30 of the MOS transistors.

Ti/TiON/AlSi are successively sputtered over the entire surface, then etching is performed leaving only the metal layer covering the contact holes to form metal electrodes 40. Due to this, a semiconductor device shown in FIG. 8 is obtained.

However, in the semiconductor device produced by the above method of production in the prior art, since the polysilicon base electrode of the NPN transistor is formed by p⁺ polysilicon, there is a problem of an increase in the resistance from the p-type base. When the base resistance is increased, the problems of a decrease in the $f_{max}$ (maximum oscillating frequency) and an increase in noise arise.

Further, it is necessary to silicide the top of the source/drain regions and the polysilicon gate electrode of the MOS transistor, then form an oxide film over the entire surface (the oxide film 33 formed at a thickness of about 100 nm in the step shown in FIG. 17A). According to the above method of production of the prior art, in the step of patterning the polysilicon base electrode 34 by RIE, the oxide film 33 is required on the PMOS and NMOS parts to prevent the substrate from being etched.

However, due to the formation of the oxide film 33, the step difference becomes larger at the collector plug (n⁺ sinker 12) of the NPN transistor and on the source/drain regions 29, 30 of the MOS transistors and the aspect ratio is increased. If the coverage of the metal electrode 40 deteriorates because of the increase in the aspect ratio, the problem also arises that the reliability of the semiconductor device decreases.

SUMMARY OF THE INVENTION

The present invention has as its object to provide a method of producing a semiconductor device for forming a BiCMOS transistor whereby the resistances can be decreased in a base polysilicon electrode of a bipolar transistor and in source/drain regions of a MOS transistor having an LDD (lightly doped drain) structure.

The present invention also has as its object to provide a method of producing a semiconductor device in which the thickness and step difference of an insulating film can be reduced with simplified production steps.

To achieve the above object, the method of producing a semiconductor device provides a method of producing a semiconductor device comprising a first semiconductor element comprising a collector region, an emitter region, and a base region and a second semiconductor element comprising a source region, a drain region, and a gate electrode, the first and second semiconductor elements being formed on a same substrate, characterized by comprising the steps of forming a first semiconductor layer containing impurity on the substrate, and forming a gate electrode of the second semiconductor element; forming an insulating film at least on the first and the second semiconductor elements; forming a hole in the insulating film at a first semiconductor element forming region, and depositing a second semiconductor layer on the insulating film; removing the second semiconductor layer and the insulating film on the second semiconductor element except on the side faces of the gate electrode to form insulator sidewalls at the gate electrode; forming the source region and the drain region of the second semiconductor element; forming a refractory metal layer and annealing to react the surface of the second semiconductor layer on the first semiconductor element and the surfaces of the source region, the drain region, and the gate electrode of the second semiconductor element with the refractory metal; and patterning the second semiconductor layer on the first semiconductor element as required to form the base electrode of the first semiconductor element.

The method of producing a semiconductor device preferably is characterized in that the first and the second semiconductor layers comprise polysilicon and the step of reacting the semiconductor layers with the refractory metal comprises a step of forming a refractory metal silicide on the surfaces of the semiconductor layers.

Further, the method of producing a semiconductor device preferably is characterized in that the method further comprises a step of diffusing an impurity into the source region and the drain region before the step of forming the insulating film and the step of forming the source region and the drain region at the second semiconductor element comprises a step of diffusing an impurity using the insulator sidewall as a mask.

The method of producing a semiconductor device is preferably characterized in that the refractory metal is selected from the group comprising titanium, tungsten, molybdenum, cobalt, nickel, and platinum.

Further, to achieve the above objects, the method of producing a semiconductor device of the present invention provides a method of producing a semiconductor device comprising a first semiconductor element comprising a collector region, an emitter region, and a base region; a second semiconductor element comprising a source region, a drain region, and a gate electrode; and a resistor formed by a semiconductor, the first and second semiconductor elements and resistor being formed on a same substrate, characterized by comprising the steps of forming a first semiconductor layer containing impurity on the substrate, patterning the layer as required to form a gate electrode of the second semiconductor element and the resistor concomitantly; forming an insulating film at least on the first and the second semiconductor elements; forming a hole in the insulating film at a first semiconductor element forming region, and depositing a second semiconductor layer on the insulating film and in the hole; removing the second semiconductor layer and the insulating film on the second semiconductor element except on the side faces of the gate electrode to form insulator sidewalls of the gate electrode; forming the source region and the drain region of the second semiconductor element; forming a refractory metal layer over the entire surface and annealing to react the surface of the second semiconductor layer on the first semiconductor element and the surfaces of the source region, the drain region, and the gate electrode of the second semiconductor element with the refractory metal; and patterning the second semiconductor layer on the first semiconductor element as required to form the base electrode of the first semiconductor element.

The method of producing a semiconductor device of the present invention preferably is characterized in that the step of forming the first semiconductor layer containing impurity comprises the steps of diffusing an impurity in a relatively high concentration into the first semiconductor layer of the second semiconductor element forming region and diffusing an impurity in a relatively low concentration into the first semiconductor layer of the resistor forming region.

The method of producing a semiconductor device preferably of the present invention is preferably characterized in that the first and the second semiconductor layers comprise polysilicon and the step of reacting the semiconductor layers with the refractory metal comprises a step of forming a refractory metal silicide on the surfaces of the semiconductor layers.

Further, the method of producing a semiconductor device of the present invention is preferably characterized in that the method further comprises a step of diffusing an impurity into the source region and the drain region before the step of forming the insulating film and the step of forming the source region and the drain region of the second semiconductor element comprises a step of diffusing an impurity using the insulator sidewall as a mask.

The method of producing a semiconductor device of the present invention preferably is characterized in that the refractory metal is selected from the group comprising titanium, tungsten, molybdenum, cobalt, nickel, and platinum.

According to the method of producing a semiconductor device of the present invention, when the gate electrode and the source/drain regions of the MOS transistor are silicided, the base electrode (base connecting electrode) of the NPN transistor is silicided concomitantly. Therefore, it is possible to decrease the base resistivity while the production steps are simplified. In the above step of forming silicide, the polysilicon resistance is not silicided because it is covered with the insulating film or the polysilicon layer (the second semiconductor layer). Therefore, the polysilicon resistance retains a high resistivity.

Further, to achieve the object objects, the method of producing a semiconductor device of the present invention provides a method of producing a semiconductor device comprising a first semiconductor element comprising a collector region, an emitter region, and a base region and a second semiconductor element comprising a source region, a drain region, and a gate electrode, the first and second semiconductor elements being formed on a same substrate, characterized by comprising the steps of forming a first semiconductor layer containing impurity on the substrate, and patterning the layer as required to form a gate electrode of the second semiconductor element; forming an insulating film at least on the first and the second semiconductor elements; forming a hole in the insulating film at a first semiconductor element forming region to expose the substrate; depositing a second semiconductor layer over the entire surface; forming a mask having a required pattern on the first semiconductor element; etching the second semiconductor layer and the insulating film using the mask to form the base electrode of the first semiconductor element, and concomitantly forming insulator sidewalls of the gate electrode by leaving the insulating film on the side faces of the gate electrode; removing the mask; forming the source region and the drain region of the second semiconductor element; and forming a refractory metal layer over the entire surface and annealing to react the surface of the base electrode and a plug of the collector region on the first semiconductor element and the surfaces of the source region, the drain region, and the gate electrode of the second semiconductor element with the refractory metal.

The method of producing a semiconductor device of the present invention preferably is characterized in that the first and the second semiconductor layers comprise polysilicon and the step of reacting the semiconductor layers with the refractory metal comprises a step of forming a refractory metal silicide on the surfaces of the semiconductor layers.

Further, the method of producing a semiconductor device of the present invention preferably is characterized in that the method further comprises a step of diffusing an impurity into the source region and the drain region before the step of forming the insulating film and the step of forming the source region and the drain region of the second semiconductor element comprises a step of diffusing an impurity using the insulator sidewall as a mask.

The method of producing a semiconductor device of the present invention preferably is characterized in that the refractory metal is selected from the group comprising titanium, tungsten, molybdenum, cobalt, nickel, and platinum.

According to the method of producing a semiconductor device of the present invention, when the gate electrode and the source/drain regions of the MOS transistor are silicided, the base electrode (base connecting electrode) and the surface of the collector plug of the NPN transistor are silicided concomitantly. Therefore, it is possible to decrease the base resistance and the collector resistance while the production steps are simplified. Further, when etching (RIE, for example) for forming the source/drain regions of LDD structure, the base electrode of the NPN transistor is formed by using the same mask. Therefore, the number of production steps can be reduced, and the cost for producing the semiconductor device can be decreased.

BRIEF DESCRIPTION OF THE DRAWINGS

These and other objects and features of the present invention will become clearer from the following description of the preferred embodiments given with reference to the accompanying drawings, in which:

FIGS. 2A–2C are a cross-sectional view of a production step of the method of producing a semiconductor device of the present invention;

FIGS. 4A–4C are a cross-sectional view of a production step of the method of producing a semiconductor device of the present invention;

FIGS. 7A–7C are a cross-sectional view of a production step of the method of producing a semiconductor device of the present invention;

FIGS. 9A–9C are a cross-sectional view of a production step of the method of producing a semiconductor device of the related art;

FIGS. 10A–10C are a cross-sectional view of a production step of the method of producing a semiconductor device of the related art;

FIGS. 11A–11C are a cross-sectional view of a production step of the method of producing a semiconductor device of the related art;

FIGS. 12A–12C are a cross-sectional view of a production step of the method of producing a semiconductor device of the related art;

FIGS. 13A–13B are a cross-sectional view of a production step of the method of producing a semiconductor device of the related art;

FIGS. 14A–14C are a cross-sectional view of a production step of the method of producing a semiconductor device of the related art;

FIGS. 16A–16C are a cross-sectional view of a production step of the method of producing a semiconductor device of the related art; and FIGS. 17A–17C are a cross-sectional view of a production step of the method of producing a semiconductor device of the related art.

DESCRIPTION OF THE PREFERRED EMBODIMENTS

Below, the modes of working the method of producing semiconductor device of the present invention will be explained with reference to the drawings.

First Embodiment

Figure 1:
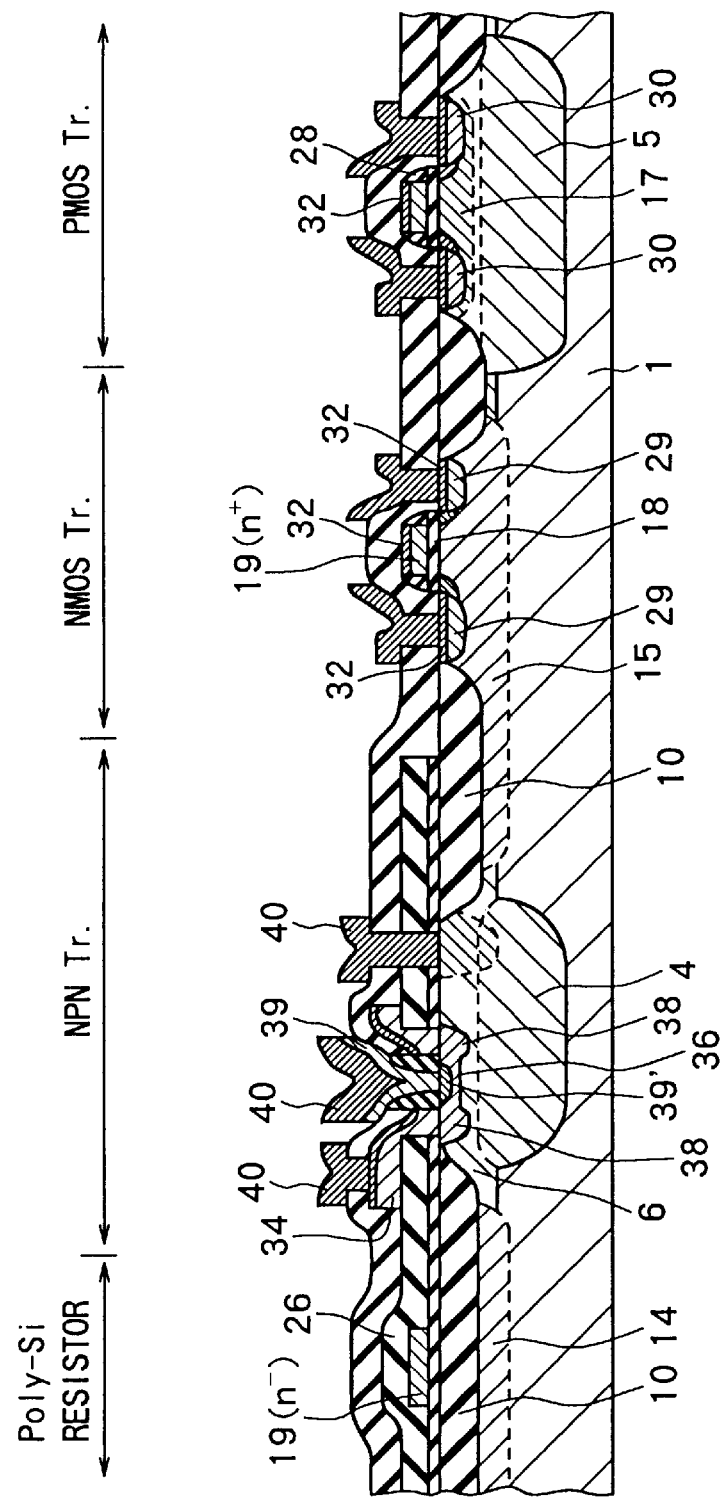
FIG. 1 is a cross-sectional view of a semiconductor device produced by the method of producing a semiconductor device of the present invention.

FIG. 1 is a cross-sectional view of a semiconductor device produced by the method of producing a semiconductor device of the present embodiment. According to the method of production of the present embodiment, an NPN transistor, a CMOS consisting of an NMOS and a PMOS, and a polysilicon resistor are concomitantly formed on a same substrate (consisting of a p-type Si substrate 1 and an n-type epitaxial layer 6).

In a polysilicon resistor part, a resistor 19(n⁻) formed by n⁻ polysilicon is formed. In a vertical NPN transistor part, below the n-type epitaxial layer 6 forming a n-collector region, an n-type buried collector layer 4 is formed to increase the withstand voltage between the base and collector. A p-type base region consisting of an intrinsic base region 36 and a graft base region 38, connected to each other, is formed at the surface of the n-type epitaxial layer 6. An n-type emitter diffusion layer 39' is formed at the surface.

In an NMOS transistor part, n-type source/drain regions 29 are formed at the surface of a p-well 15, and a gate electrode formed by an $n^+$ polysilicon 19($n^+$) is formed between the source and the drain via a gate oxide film 18. The surface of the n-type source/drain 29 and the $n^+$ gate electrode 19 are silicided for decreasing the resistance and become titanium silicide 32.

In a PMOS transistor part, an n-type isolation layer 5 is formed for isolation from the p-substrate 1, and an n-well 17 is implanted in n-type epitaxial layer 6. P-type source/drain regions 30 are formed in the n-well 17, and a gate electrode formed by $n^+$ polysilicon 19($n^+$) is formed between the source and drain via a gate oxide film 18. The surface of the p-type source/drain 30 and the $n^+$ gate electrode 19($n^+$) are also silicided for decreasing resistance and become titanium silicide 32.

A LOCOS 10 is formed at the surface of the substrate between transistors. A p-type buried isolation region 14 connecting to the p-type Si substrate 1 is formed below the LOCOS 10.

Next, an explanation will be made of a method of producing a semiconductor device of the above present embodiment with reference to FIG. 2 to FIG. 4.

First, in the same way as the steps shown in FIG. 9A to FIG. 15A of the method for producing a semiconductor device of the prior art, a substrate consisting of a p-type silicon substrate 1 and an n-type epitaxial layer 6 is formed with an $n^-$ polysilicon resistor 19($n^-$), n-type buried collector layer 4 and $n^+$ sinker 12 of the NPN transistor, a p-well 15 and n-type LDD 24 of the NMOS transistor, n-type isolation layer 5, n-well 17, and p-type LDD 25 of the PMOS transistor, and $n^+$ polysilicon gate electrode 19($n^+$) of the NMOS and PMOS transistors.

After this, as shown in FIG. 2A, an oxide film 26 is formed for forming an opening in an active region of the NPN transistor.

As shown in FIG. 2B, RIE is performed on the oxide film 26 of the active region of the NPN transistor for forming an opening. Moreover, using the oxide film 26 as a mask, light-etching is performed with hydrofluoric acid. Thus the gate oxide film 18 of the opening is removed and the substrate (n-type epitaxial layer 6) is exposed.

Further, as shown in FIG. 2B, a polysilicon layer 34 is formed by the CVD process over the entire surface at a thickness of about 150 to 300 nm. A p-type impurity such as $BF_2^+$ is ion-implanted in the polysilicon layer 34 to form the $p^+$ polysilicon layer.

Next, as shown in FIG. 2C, a photoresist 41 having an opening at the MOS transistor forming region is formed. Using the photoresist 41 as a mask, RIE is performed to remove the $p^+$ polysilicon layer 34 on the MOS transistor forming region.

Figures 3A, 3B, 3C:
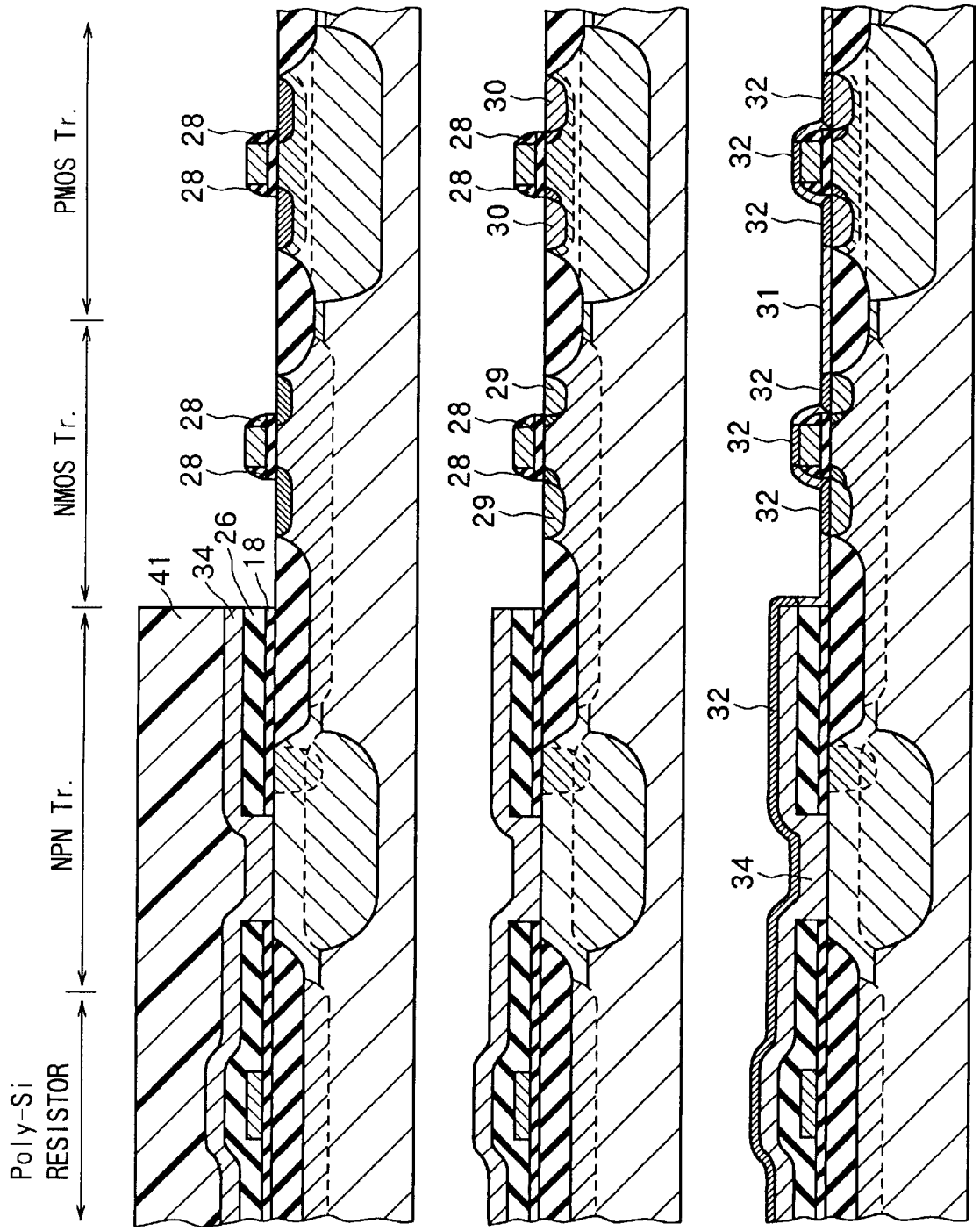
FIGS. 3A–3C are a cross-sectional view of a production step of the method of producing a semiconductor device of the present invention.

Moreover, as shown in FIG. 3A, using the photoresist 41 as a mask, RIE is performed on the oxide film 26 and the gate oxide film 18 to form an LDD spacer 28 of a width of 0.15 µm. At that time, the active region of the NPN transistor is covered with the photoresist 41, thus damage due to the RIE is prevented.

The photoresist 41 is removed, then, as shown in FIG. 3B, an n-type impurity is ion-implanted in the NMOS transistor forming region, using the LDD spacer 28 as a mask, to form $n^+$ source/drain regions 29. A p-type impurity is ion-implanted in the PMOS transistor forming region, using the LDD spacer 28 as a mask, to form the $p^+$ source/drain regions 30.

Next, as shown in FIG. 3C, a refractory metal layer such as a Ti layer 31 is formed by a process such as sputtering over the entire surface. Annealing is performed at 500 to 700° C. for about 10 to 30 minutes to silicide the top of the polysilicon base electrode 34 of the NPN transistor and the surfaces of the source/drain regions 29, 30 of the MOS transistors, and polysilicon gate electrodes 19($n^+$).

After this, the parts of the unreacted Ti layer 31 on the insulating film are removed by wet-etching. Due to this, the structure shown in FIG. 4A is obtained. At that time, the region in which the polysilicon resistor is formed is covered with a $p^+$ polysilicon layer 34 formed for forming a polysilicon base electrode, thus it is not silicided and a polysilicon resistor with a high resistivity can be formed.

Next, using a photoresist (not shown), dry-etching is performed on the silicided $p^+$ polysilicon layer to form a base electrode 34 of the NPN transistor as shown in FIG. 4B.

As shown in FIG. 4C, an oxide film ($SiO_2$) 35 is formed by the CVD process over the entire surface at a thickness of about 300 nm. The oxide film 35 and the polysilicon layer (base electrode 34) in the emitter forming region of the NPN transistor are etched in sequence, thus an opening is formed and the Si substrate is exposed. In the opening on the emitter forming region, $BF_2$, for example, is ion-implanted under conditions of 30 to 50 keV in acceleration energy and $1\times10^{13}$ to $1\times10^{14}$ atoms/cm$^2$ in dosage, whereby an intrinsic base region 36 of the NPN transistor is formed.

Moreover, for forming a sidewall at the emitter forming region, a oxide film (not shown) is formed by the CVD process over the entire surface at a thickness of about 600 nm. Annealing is performed at 850 to 900° C. for 10 minutes, then the oxide film (not shown) is etch backed over the entire surface. Due to this, an emitter/base isolating sidewall 37 is formed.

Due to the annealing at this time, the impurity diffuses from the polysilicon base electrode 34 of the NPN transistor into the n-type epitaxial layer 6. Thus, the graft base region 38 is formed and connects to the activated intrinsic base region 36.

Next, for forming the emitter polysilicon 39 (FIG. 1) of the NPN transistor, a polysilicon layer is deposited by the CVD process over the entire surface at a thickness of about 150 nm. Then, arsenic (As) is ion-implanted under conditions of 30 to 70 keV in acceleration energy and $1\times10^{15}$ to $1\times10^{16}$ atoms/cm$^2$ in dosage. Next, by annealing at 1000 to 1100° C. for 5 to 30 seconds, the impurity diffuses from the emitter polysilicon 39 to form an emitter diffusion layer 39' as shown in FIG. 1. After this, the emitter polysilicon 39 is patterned by dry-etching to leave the emitter part.

Further, as shown in FIG. 1, RIE is performed to form contact holes in the polysilicon base electrode 34 and $n^+$ sinker 12, connecting to the collector, of the NPN transistor, and on the gate polysilicon 19($n^+$) and the source/drain regions 29, 30 of the MOS transistor.

Ti/TiON/AlSi are successively sputtered over the entire surface, then etching is performed, leaving only the metal layers on the contact holes, to form metal electrodes 40. Due to this, the semiconductor device shown in FIG. 1 is obtained.

According to the method of producing a semiconductor device of the above present embodiment, when the gate electrode 19($n^+$) and the source/drain regions 29, 30 of the MOS transistor are silicided, the base electrode (base connecting electrode) of the NPN transistor is also silicided simultaneously. Therefore, it is possible to simplify the production steps and to decrease the base resistance.

Further, as shown in FIG. 3C, in the step of forming silicide on the Ti layer 31, the polysilicon resistor 19($n^-$) is covered with the oxide film 26 and the polysilicon layer 34, thus it is not silicided. Therefore, a high resistance in the polysilicon resistor is kept.

Second Embodiment

Figure 5:
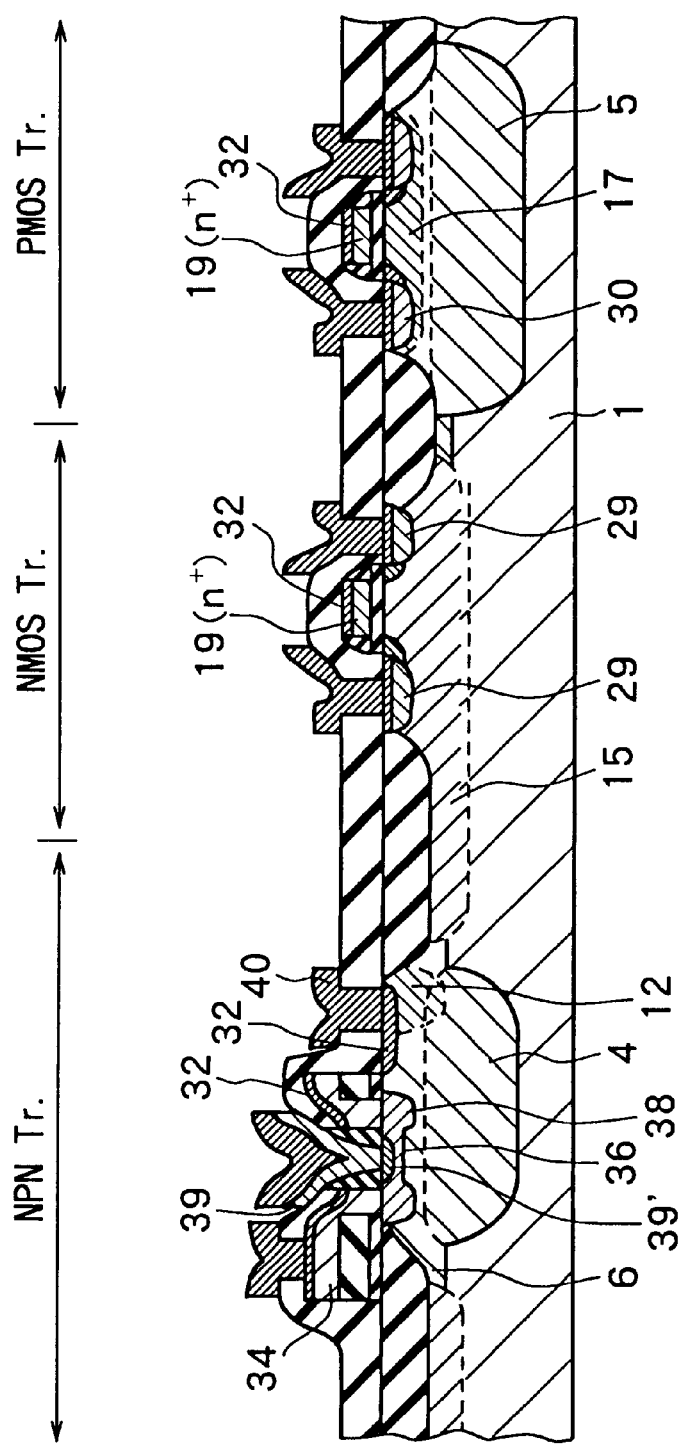
FIG. 5 is a cross-sectional view of a semiconductor device produced by the method of producing a semiconductor device of the present invention.

FIG. 5 is a cross-sectional view of a semiconductor device produced by the method of producing a semiconductor device of the present embodiment. According to the method of production of the present embodiment, an NPN transistor and a CMOS consisting of an NMOS and a PMOS are concomitantly formed on a same substrate consisting of a p-type Si substrate 1 and an n-epitaxial layer 6. In the case where there is no need to form a polysilicon resistor, it is possible to simplify the production steps compare to the first embodiment. In addition, the resistivity of a collector plug 12 of the NPN transistor can be decreased.

In the vertical NPN transistor part of the semiconductor device shown in FIG. 5, an n-type buried collector layer 4 is formed in the same way as in the first embodiment for raising the withstand voltage between the base and collector. A p-type base region consisting of an intrinsic base region 36 and a graft base region 38, which connect to each other, is formed at the n-type epitaxial layer 6. An n-type emitter diffusion layer 39' is formed at the surface of the base region. Titanium silicide 32 is formed on the surface of an $n^+$ sinker 12 which connects to the collector and on the surface of the polysilicon base electrode.

In an NMOS transistor part, in the same way as in the first embodiment, a p-well 15, n-type source/drain regions 29, and a gate electrode formed by a gate oxide 18 and $n^+$ polysilicon 19($n^+$) are formed. The surface of the n-type source/drain 29 and the $n^+$ gate electrode 19($n^+$) are silicided for decreasing resistance and become titanium silicide 32.

In a PMOS transistor part, in the same way as in the first embodiment, an n-type isolating layer 5 is formed for isolation from the p-substrate 1. An n-well 17, p-type source/drain regions 30, and a gate electrode formed by a gate oxide 18 and $n^+$ polysilicon 19($n^+$) are formed. The surface of the p-type source/drain regions 30 and the same of the $n^+$ gate electrode 19($n^+$) are also silicided for decreasing resistance and become titanium silicide 32.

Between on transistor and another, LOCOS 10 is formed on the substrate. And p-type buried isolation region 14, connecting to the p-Si substrate 1, is formed below the LOCOS 10.

Next, an explanation will be made of a method of producing a semiconductor device of the above present embodiment with reference to FIG. 6 to FIG. 7.

Figure 6A:
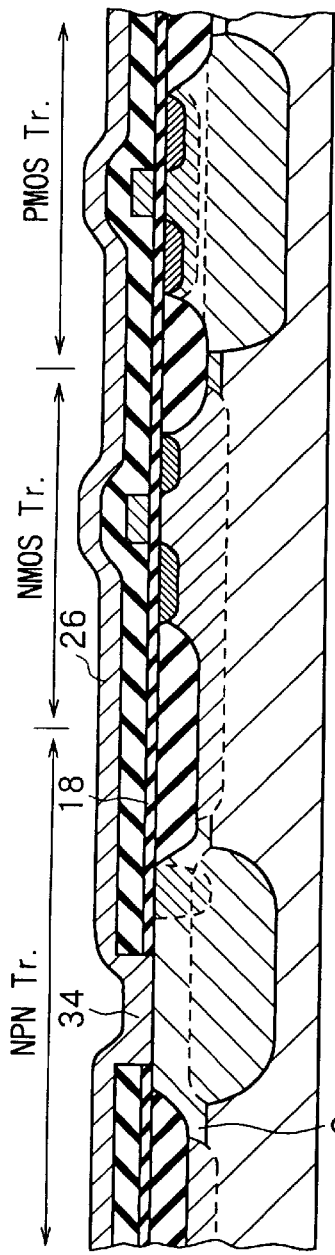
FIGS. 6A–6C are a cross-sectional view of a production step of the method of producing a semiconductor device of the present invention.

First, as shown in FIG. 6A, omitting only the step of forming the $n^-$ polysilicon resistor 19($n^-$) in the steps shown in FIG. 9A to FIG. 15A of the method of producing a semiconductor device of the prior art, a double-polysilicon substrate structure substrate is formed with an n-buried collector layer 4 and an $n^+$ sinker 12 of the NPN transistor, a p-well 15 and n-type LDD 24 of the NMOS transistor, and n-type isolating layer, an n-well 17, and p-type LDD 25 of the PMOS transistor, and an $n^+$-polysilicon gate electrodes 19($n^+$) of the NMOS and the PMOS transistors.

After this, as shown in FIG. 6A, an oxide film 26 is formed for forming an opening in an active region of the NPN transistor. Next, RIE is performed on the oxide film 26 of the active region of the NPN transistor for forming an opening. Moreover, using the oxide 26 as a mask, light-etching is performed with hydrofluoric acid to remove the gate oxide 18 of the opening and expose the substrate (n-type epitaxial layer 6).

Further, polysilicon layer 34 is formed by the CVD process over the entire surface at a thickness of about 150 to 300 nm. A p-type impurity such as $BF_2^+$ is ion-implanted in the polysilicon layer 34 to form a $p^+$ polysilicon layer.

Figure 6B:
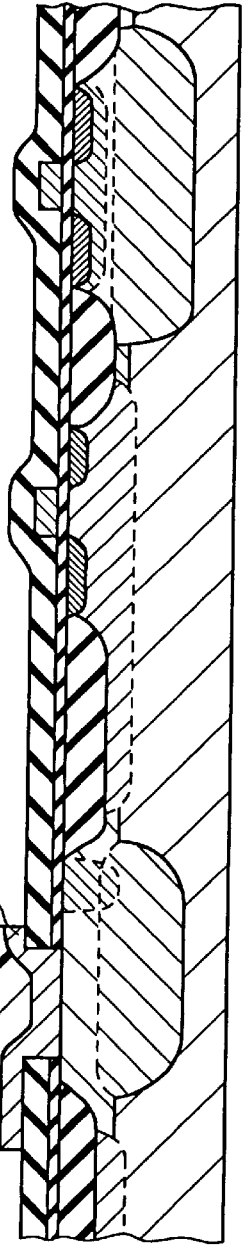

Next, as shown in FIG. 6B, a photoresist 42 having the pattern of the base electrode of the NPN transistor is formed. Using the photoresist 42 as a mask, RIE is performed to remove the $p^+$ polysilicon layer 34 except from the base electrode of the NPN transistor.

Figure 6C:
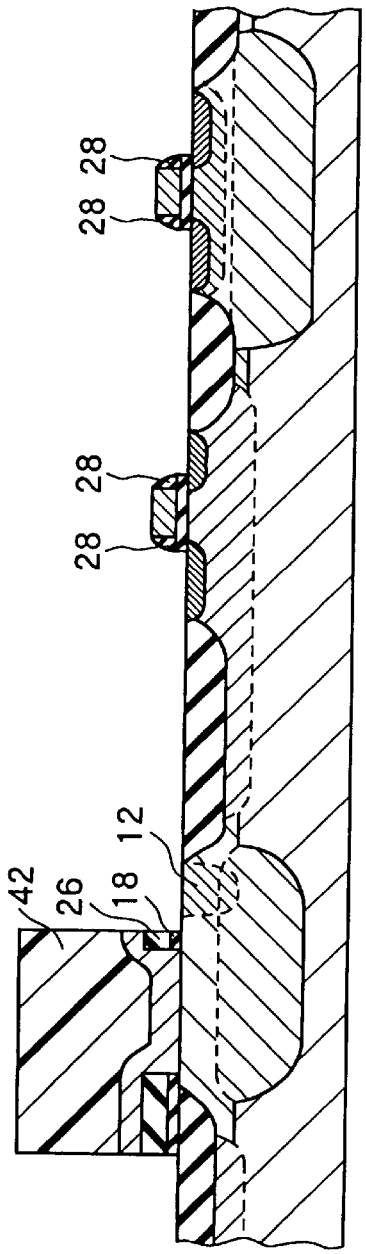
Figure 8:
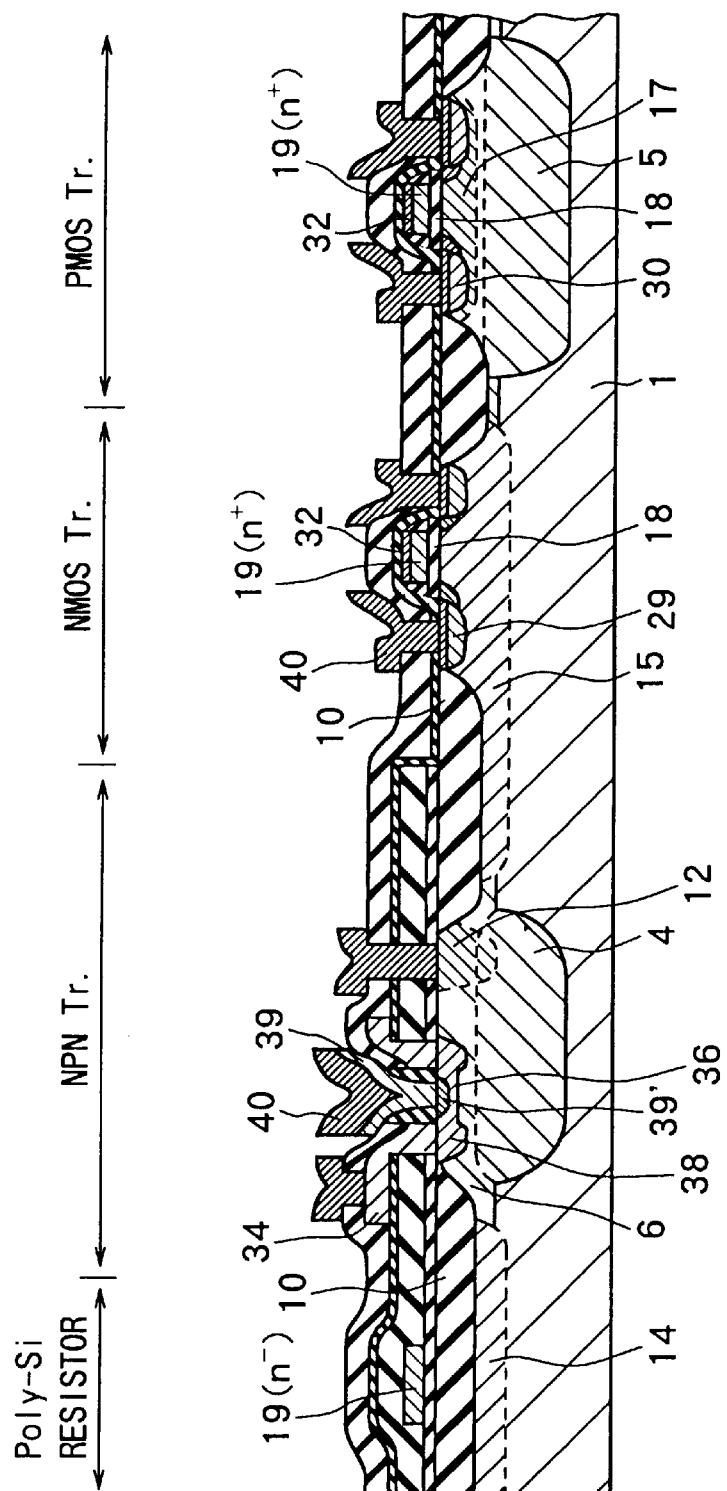
FIG. 8 is a cross-sectional view of a semiconductor device produced by the method of producing a semiconductor device of the related art.
Figure 15A:
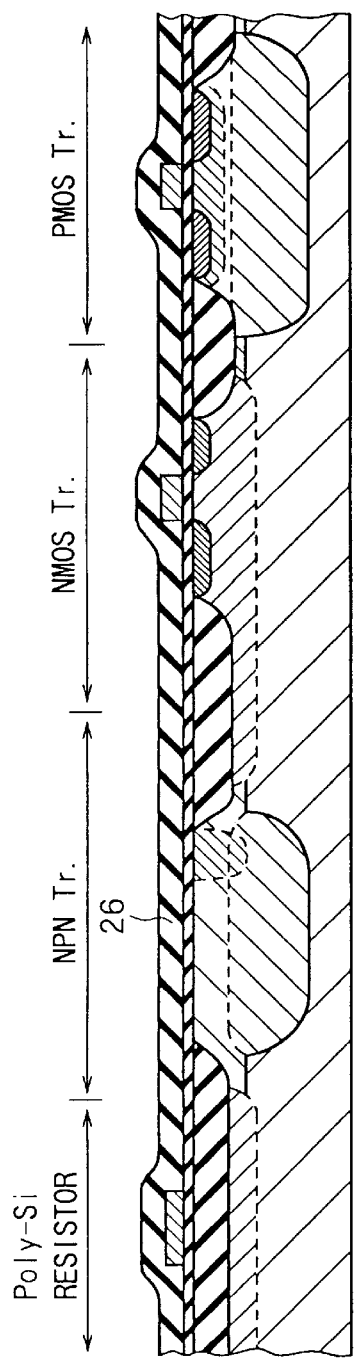
FIGS. 15A–15C are a cross-sectional view of a production step of the method of producing a semiconductor device of the related art.
Figure 15B:
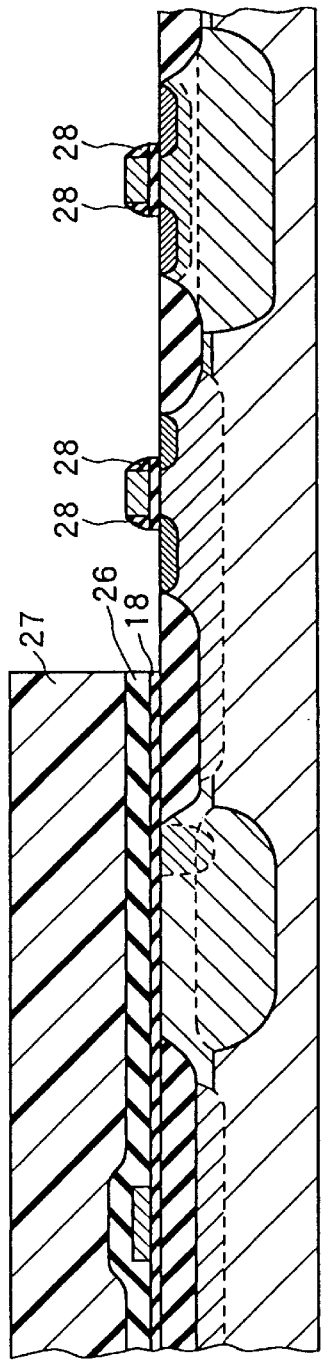
Figure 15C:
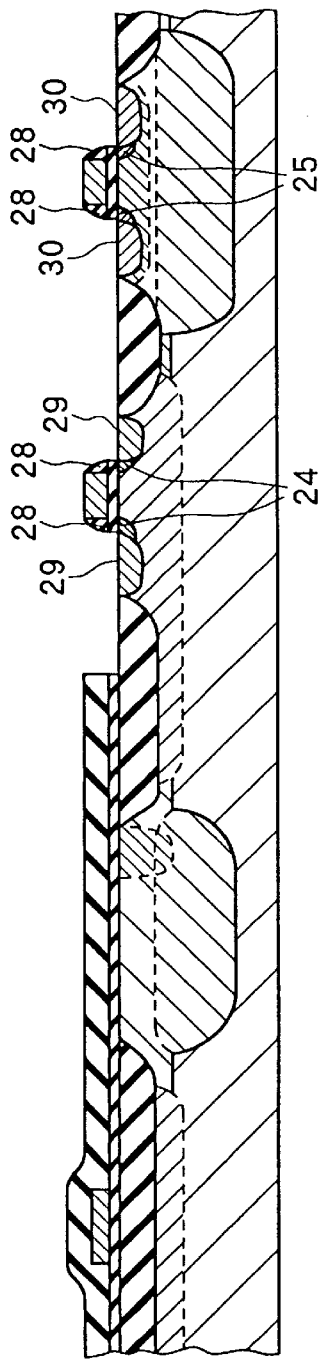

Moreover, as shown in FIG. 6C, using the photoresist 42 as a mask, RIE is performed on the oxide film 26 and the gate oxide film 18 to form an LDD spacer 28 of a width of 0.15 $\mu$m. By the RIE, the Si substrate (n-type epitaxial layer 6) is exposed at the source/drain forming regions of the MOS transistors and at the collector plug 12 of the NPN transistor. The active region of the NPN transistor is covered with the photoresist 42, thus damage due to the RIE is prevented.

The photoresist 42 is removed, then, as shown in FIG. 7A, an n-impurity is ion-implanted in the NMOS transistor forming region, using the LDD spacer 28 as a mask, to form $n^+$ source/drain regions 29. And p-impurity is ion-implanted in the PMOS transistor forming region, using the LDD spacer 28 as a mask, to form $p^+$ source/drain regions 30.

Next, in the same way as in the first embodiment, a refractory metal layer such as the Ti layer 31 is formed by a process such as sputtering over the entire surface, then annealing is performed at 500 to 700° C. for about 10 to 30 minutes for silicidation, then the unreacted Ti layer formed on the insulating film is removed by wet-etching. Due to this, as shown in FIG. 7B, titanium silicide ($TiSi_x$) 32 is formed on the polysilicon base electrode 34 and the collector plug ($n^+$ sinker) 12 of the NPN transistor and on the source/drain regions 29, 30 and the polysilicon 19($n^+$) on the gate electrode of the MOS transistor.

When the Ti layer is being silicided, since an LDD spacer 28 is formed between the source/drain regions and the gate polysilicon 19($n^+$) in the MOS transistor, formation of a bridge of silicide is suppressed and occurrence of short-circuits is prevented.

As shown in FIG. 7C, an oxide film ($SiO_2$) 35 is formed by the CVD process over the entire surface at a thickness of about 300 nm. The oxide film 35 and the polysilicon layer (base electrode) 34 in the emitter forming region of the NPN transistor are etched in sequence to form an opening and expose the Si substrate. In the opening on the emitter forming region, $BF_2$, for example, is ion-implanted under conditions of 30 to 50 keV in acceleration energy and $1 \times 10^{13}$ to $1 \times 10^{14}$ atoms/$cm^2$ in dosage, whereby an intrinsic base region 36 of the NPN transistor is formed.

Moreover, for forming sidewalls at the emitter forming region, an oxide film (not shown) is formed by the CVD process over the entire surface at a thickness of about 600 nm, annealing is performed at 850 to 900° C. for 10 minutes, then the oxide film (not shown) is etch backed over the entire surface. Due to this, an emitter/base isolation sidewall 37 is formed.

Due to the annealing at this time, a p-type impurity diffuses from the polysilicon base electrode 34 of the NPN transistor into the n-type epitaxial layer 6. Thus, the graft base region 38 is formed and connects to the activated intrinsic base region 36.

Next, for forming the emitter polysilicon 39 (FIG. 5) of the NPN transistor, a polysilicon layer is deposited by the CVD process over the entire surface to a thickness of about 150 nm. Then, arsenic (As) is ion-implanted under conditions of 30 to 70 keV in acceleration energy and $1\times10^{15}$ to $1\times10^{16}$ atoms/cm$^2$ in dosage. Next, by annealing at 1000 to 1100° C. for 5 to 30 seconds, the impurity diffuses from the emitter polysilicon 39 and the emitter diffusion layer 39' is formed, as shown in FIG. 5. After this, the emitter polysilicon 39 is patterned by dry-etching to leave the emitter part.

Further, as shown in FIG. 5, RIE is performed to make contact holes in the polysilicon base electrode 34 and n$^+$ sinker 12, connecting to the collector, of the NPN transistor, and on the gate polysilicon 19(n$^+$) and the source/drain regions 29, 30 of the MOS transistor.

Ti/TiON/AlSi are successively sputtered over the entire surface, then etching is performed leaving only the metal layer covering the contact holes to thereby form metal electrodes 40. Due to this, the semiconductor device shown in FIG. 5 is obtained.

According to the method of producing a semiconductor device of the present embodiment mentioned above, when the polysilicon layer is silicided, the surface of the collector plug of the NPN transistor is also silicided concomitantly. Therefore, the collector resistance can be decreased.

Further, according to the method of producing a semiconductor device of the present embodiment, in the step of RIE for forming an LDD spacer (the step shown in FIG. 6C), the base electrode is patterned with the same mask as the mask for forming the LDD spacer. Therefore, the production steps can be decreased and the production cost can be cut compared to the first embodiment.

The method of producing a semiconductor device of the present embodiment is especially effective in the method of producing a semiconductor device in which a RIE step on the exposed substrate after forming the base electrode 34 is not necessary, that is, in the case where a polysilicon resistor etc. is not formed on the semiconductor device.

The method of producing a semiconductor device of the present invention is not limited to the above embodiments. For example, in addition to the titanium used as the metal for forming silicide above, it is also possible to change this to cobalt, nickel, and other refractory metals.

In addition, various modifications may be made within a range not outside the gist of the present invention.

According to the method of producing a semiconductor device of the present invention, the source/drain region of a MOS transistor and a base electrode and a collector plug of an NPN transistor are silicided in the same production step and the collector resistance and base resistance can be decreased. Therefore, it is possible to prevent a fall of $f_{max}$ and an increase of noise caused by base resistance.

Further, according to the method of producing a semiconductor device of the present invention, a polysilicon resistor of high resistivity can be formed on the same substrate with BiCMOS.

According to the method of producing a semiconductor device of the present invention, it is possible to simplify the production steps and to decrease the thickness and step difference of the insulating film. Therefore, an aspect ratio of a contact hole formed in the insulator is not increased, and the reliability of the semiconductor device can be improved.

What is claimed is:

1. A method of producing a semiconductor device comprising a first semiconductor element comprising a collector region, an emitter region, and a base region and a second semiconductor element comprising a source region, a drain region, and a gate electrode, said first and second semiconductor elements being formed on a same substrate, said method of producing a semiconductor device comprising the steps of:

forming, on the substrate, a first semiconductor layer containing an impurity which forms a gate electrode of the second semiconductor element, said first semiconductor layer comprising polysilicon;

forming an insulating film at least on the first and the second semiconductor elements;

forming a hole in the insulating film at a first semiconductor element forming region, and depositing a second semiconductor layer on the insulating film, said second semiconductor layer comprising polysilicon;

removing the second semiconductor layer and the insulating film on the second semiconductor element except on the side faces of the gate electrode to form insulator sidewalls at the gate electrode;

forming the source region and the drain region of the second semiconductor element;

forming a refractory metal layer and annealing to react the surface of the second semiconductor layer on the first semiconductor element and the surfaces of the source region, the drain region, and the gate electrode of the second semiconductor element with the refractory metal, said annealing forming a refractory metal silicide on the surfaces of the semiconductor layers; and patterning the second semiconductor layer on the first semiconductor element as required to form the base electrode of the first semiconductor element.

2. A method of producing a semiconductor device as set forth in claim 1, wherein:

said method further comprises a step of diffusing an impurity into the source region and the drain region before the step of forming the insulating film and the step of forming the source region and the drain region at the second semiconductor element comprises a step of diffusing an impurity using the insulator sidewall as a mask.

3. A method of producing a semiconductor device as set forth in claim 1, wherein the refractory metal is selected from the group comprising titanium, tungsten, molybdenum, cobalt, nickel, and platinum.

4. A method of producing a semiconductor device comprising a first semiconductor element comprising a collector region, an emitter region, and a base region; a second semiconductor element comprising a source region, a drain region, and a gate electrode; and a resistor formed by a semiconductor, said first and second semiconductor elements and resistor being formed on a same substrate, said method of producing a semiconductor device comprising the steps of:

forming a first semiconductor layer containing impurity on the substrate, patterning the first semiconductor layer as required to form a gate electrode of the second semiconductor element and the resistor concomitantly;

forming an insulating film at least on the first and the second semiconductor elements, said first semiconductor layer comprising polysilicon;

forming a hole in the insulating film at a first semiconductor element forming region, and depositing a second semiconductor layer on the insulating film and in the hole, said second semiconductor layer comprising polysilicon;

removing the second semiconductor layer and the insulating film on the second semiconductor element except on the side faces of the gate electrode to form insulator sidewalls of the gate electrode;

forming the source region and the drain region of the second semiconductor element;

forming a refractory metal layer over the entire surface and annealing to react the surface of the second semiconductor layer on the first semiconductor element and the surfaces of the source region, the drain region, and the gate electrode of the second semiconductor element with the refractory metal, said annealing forming a refractory metal silicide on the surfaces of the semiconductor layers; and patterning the second semiconductor layer on the first semiconductor element as required to form the base electrode of the first semiconductor element.

5. A method of producing a semiconductor device as set forth in claim 4, wherein the step of forming the first semiconductor layer containing impurity comprises the steps of:

diffusing an impurity in a relatively high concentration into the first semiconductor layer of the second semiconductor element forming region and diffusing an impurity in a relatively low concentration into the first semiconductor layer of the resistor forming region.

6. A method of producing a semiconductor device as set forth in claim 4, wherein:

said method further comprises a step of diffusing an impurity into the source region and the drain region before the step of forming the insulating film and the step of forming the source region and the drain region of the second semiconductor element comprises a step of diffusing an impurity using the insulator sidewall as a mask.

7. A method of producing a semiconductor device as set forth in claim 4, wherein the refractory metal is selected from the group comprising titanium, tungsten, molybdenum, cobalt, nickel, and platinum.

8. A method of producing a semiconductor device comprising a first semiconductor element comprising a collector region, an emitter region, and a base region and a second semiconductor element comprising a source region, a drain region, and a gate electrode, said first and second semiconductor elements being formed on a same substrate, said method of producing a semiconductor device comprising the steps of:

forming a first semiconductor layer containing impurity on the substrate, and patterning the first semiconductor layer as required to form a gate electrode of the second semiconductor element, said first semiconductor layer comprising polysilicon;

forming an insulating film at least on the first and the second semiconductor elements;

forming a hole in the insulating film at a first semiconductor element forming region to expose the substrate;

depositing a second semiconductor layer comprising polysilicon over the entire surface;

forming a mask having a required pattern on the first semiconductor element;

etching the second semiconductor layer and the insulating film using the mask to form the base electrode of the first semiconductor element, and concomitantly forming insulator sidewalls of the gate electrode by leaving the insulating film on the side faces of the gate electrode;

forming the source region and the drain region of the second semiconductor element; and forming a refractory metal layer over the entire surface and annealing to react the surface of the base electrode and a plug of the collector region on the first semiconductor element and the surfaces of the source region, the drain region, and the gate electrode of the second semiconductor element with the refractory metal, said annealing forming a refractory metal silicide on the surfaces of the semiconductor layers.

9. A method of producing a semiconductor device as set forth in claim 8, wherein:

said method further comprises a step of diffusing an impurity into the source region and the drain region before the step of forming the insulating film and the step of forming the source region and the drain region of the second semiconductor element comprises a step of diffusing an impurity using the insulator sidewall as a mask.

10. A method of producing a semiconductor device as set forth in claim 8, wherein the refractory metal is selected from the group comprising titanium, tungsten, molybdenum, cobalt, nickel, and platinum.

* * * * *